US007196391B2

(12) United States Patent
Hsieh

(10) Patent No.: US 7,196,391 B2
(45) Date of Patent: Mar. 27, 2007

(54) MOS OR CMOS SENSOR WITH MICRO-LENS ARRAY

(75) Inventor: Tzu-Chiang Hsieh, Fremont, CA (US)

(73) Assignee: e-Phocus, Inc., San Jose, CA (US)

( * ) Notice: Subject to any disclaimer, the term of this patent is extended or adjusted under 35 U.S.C. 154(b) by 0 days.

(21) Appl. No.: 11/481,655

(22) Filed: Jul. 5, 2006

(65) Prior Publication Data

US 2006/0249765 A1  Nov. 9, 2006

Related U.S. Application Data

(63) Continuation-in-part of application No. 11/361,426, filed on Feb. 24, 2006, and a continuation-in-part of application No. 11/389,356, filed on Mar. 24, 2006, which is a continuation-in-part of application No. 10/921,387, filed on Aug. 18, 2004, and a continuation-in-part of application No. 10/746,529, filed on Dec. 23, 2003, and a continuation-in-part of application No. 10/648,129, filed on Aug. 26, 2003, now Pat. No. 6,809,358, which is a continuation-in-part of application No. 10/229,953, filed on Aug. 27, 2002, and a continuation-in-part of application No. 10/229,954, filed on Aug. 27, 2002, now Pat. No. 6,791,130, and a continuation-in-part of application No. 10/229,955, filed on Aug. 27, 2002, and a continuation-in-part of application No. 10/229,956, filed on Aug. 27, 2002, now Pat. No. 6,798,033, said application No. 10/648,129 is a continuation-in-part of application No. 10/371,618, filed on Feb. 22, 2003, now Pat. No. 6,730,900, and a continuation-in-part of application No. 10/072,637, filed on Feb. 5, 2002, now Pat. No. 6,730,914.

(51) Int. Cl.
*H01L 31/00* (2006.01)

(52) U.S. Cl. ............... 257/444; 257/291; 257/292; 257/461; 257/462

(58) Field of Classification Search ............... None
See application file for complete search history.

(56) References Cited

U.S. PATENT DOCUMENTS 6,759,262 B2 *  7/2004  Theil et al.  ............... 438/48

* cited by examiner

*Primary Examiner*—Evan Pert
*Assistant Examiner*—Tan Tran
(74) *Attorney, Agent, or Firm*—John R. Ross

(57) ABSTRACT

A MOS or CMOS sensor with a multi-layer photodiode layer covering an array of active pixel circuits. The multi-layer photodiode layer of each pixel is fabricated as continuous layers of charge generating material on top of the MOS and/or CMOS pixel circuits so that extremely small pixels are possible with almost 100 percent packing factors. The sensor includes special features to minimize or eliminate pixel to pixel crosstalk. A micro-lens array with a micro-lens positioned above each pixel directs light illuminating the pixel toward the central portion of the pixel and away from its edges. Also, preferably carbon is added to doped amorphous silicon N or P bottom layer of the multi-layer photodiode layer to increase the electrical resistivity in the bottom layer to further discourage crosstalk. In preferred embodiments each of the pixels define a tiny surface area equal to or larger than about 3.24 square microns and smaller than or equal to about 25 square microns. Detailed descriptions are provided for two general types of sensors. The first type has a pixel count of about 0.3 to 1.9 million pixels and are especially suited for sues such as cell phone cameras. The second type with pixel count of between about 1.9 million pixels to more than 5 million pixels is especially suited for high definition television cameras.

32 Claims, 15 Drawing Sheets

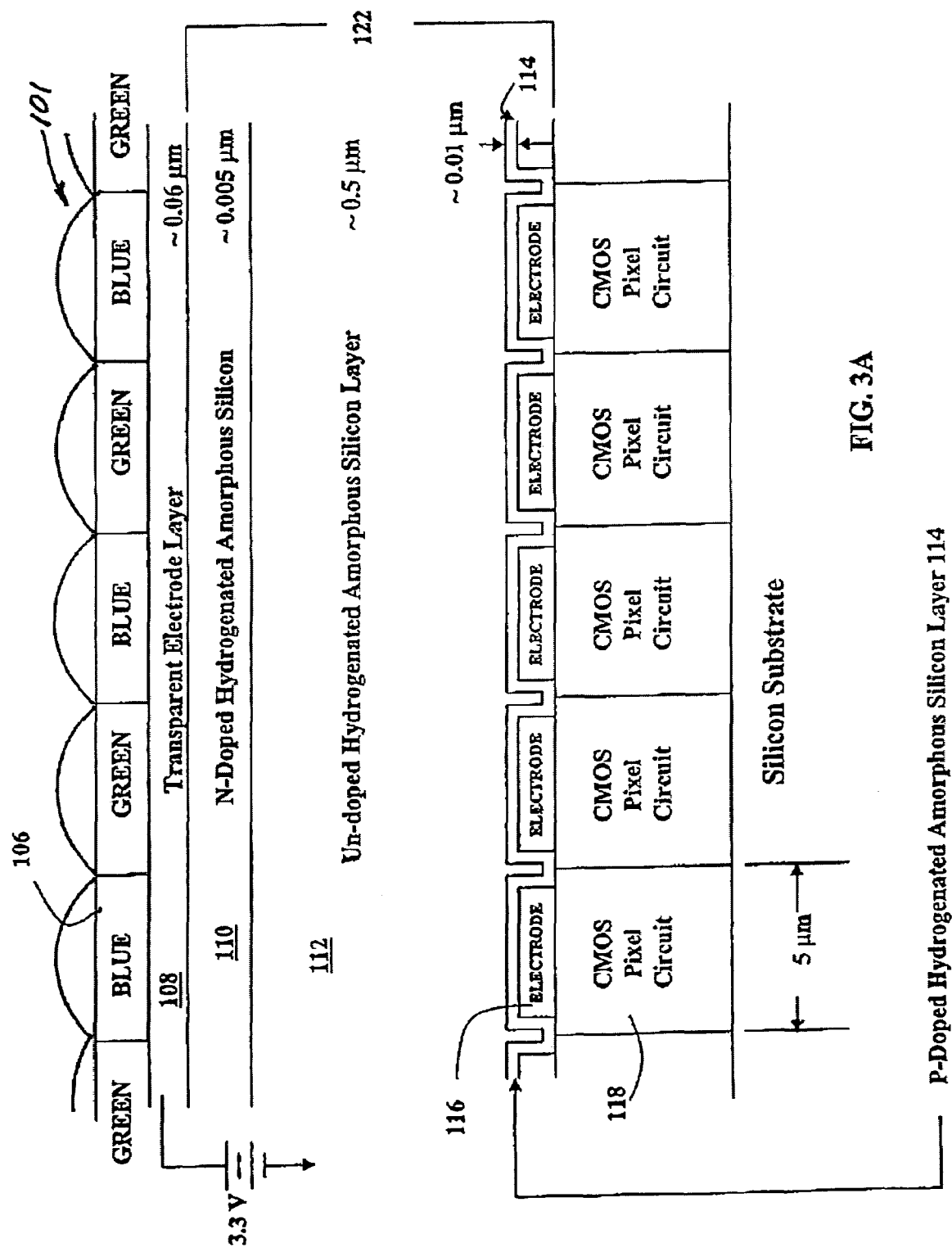

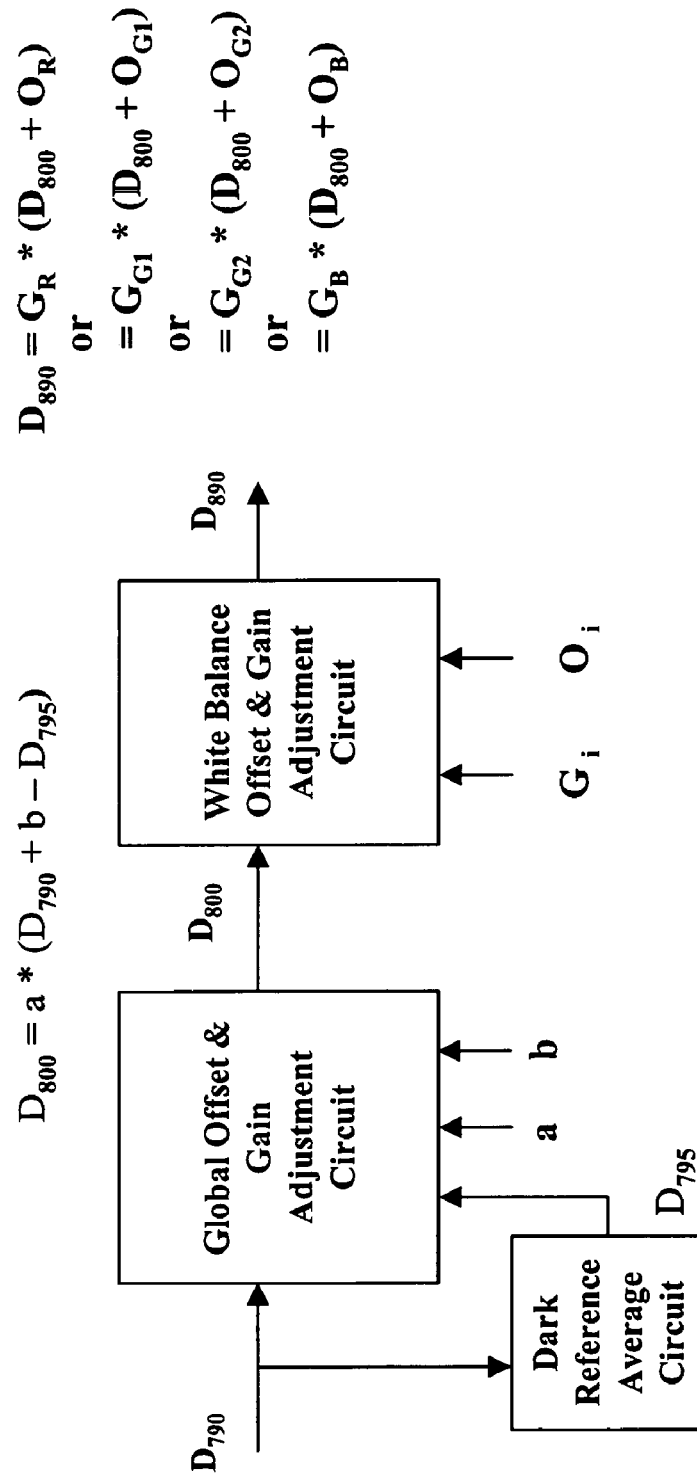
FIG. 8 Digital Signal Processing Chain
FIG. 9 Color Filter Array

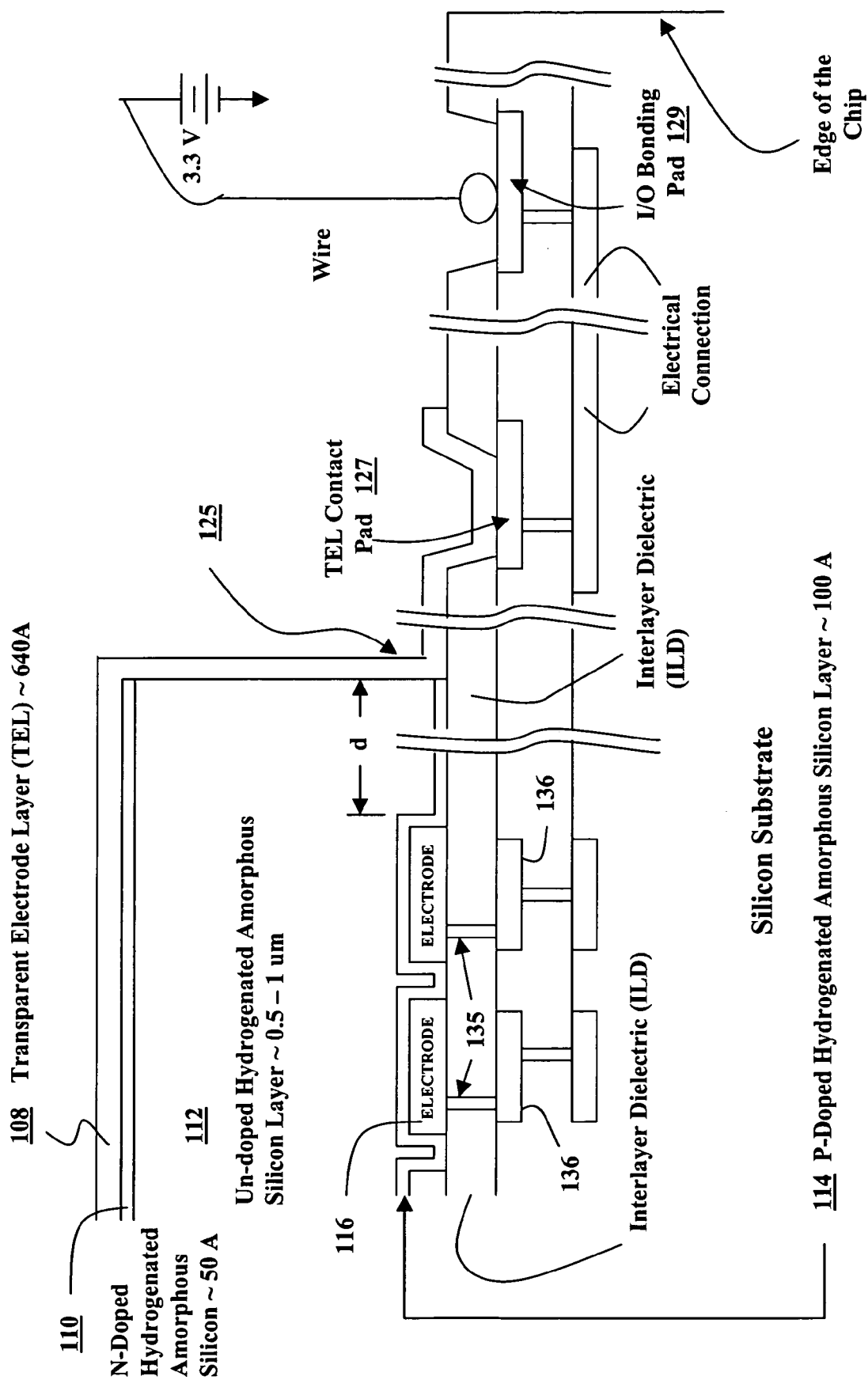

MOS OR CMOS SENSOR WITH MICRO-LENS ARRAY

FIELD OF THE INVENTION

This application is a continuation in part of U.S. patent applications Ser. No. 11/361,426 filed Feb. 24, 2006, Ser. No. 11/389,356 filed Mar. 24, 2006 and Ser. No. 10/921,387, filed Aug. 18, 2004 which is a continuation in part of Ser. Nos. 10/229,953 filed Aug. 27, 2002; 10/229,954 filed Aug. 27, 2002 (now U.S. Pat. No. 6,791,130); 10/229,955 filed Aug. 27, 2002; 10/229,956 filed Aug. 27, 2002, (now U.S. Pat. No. 6,798,033); 10/648,129 filed Aug. 26, 2003, (now U.S. Pat. No. 6,809,358); 10/746,529 filed Dec. 23, 2003. Ser. No. 10/648,129 was a continuation in part of Ser. No. 10/072,637 filed Feb. 5, 2002 (now U.S. Pat. No. 6,730,914 and Ser. No. 10/371,618 filed Feb. 22, 2003 (now U.S. Pat. No. 6,730,900). All of the above patents and patent applications are hereby incorporated herein by reference. The present invention relates to cameras and in particular to cameras with MOS or CMOS sensors.

BACKGROUND OF THE INVENTION

Electronic image sensors are typically comprised of a large number of very small light detectors, together called "pixel arrays". These sensors typically generate electronic signals that have amplitudes that are proportional to the intensity of the light received by each of the detectors in the array. Electronic cameras comprise imaging components to produce an optical image of a scene onto the pixel array. The electronic image sensors convert the optical image into a set of electronic signals. These electronic cameras typically include components for conditioning and processing the electronic signals to allow images to be converted into a digital format so that the images can be processed by a digital processor and/or transmitted digitally. Various types of semiconductor devices can be used for acquiring the image. These include charge couple devices (CCDs), photodiode arrays and charge injection devices. The most popular electronic image sensors utilize arrays of CCD detectors for converting light into electrical signals. These detectors have been available for many years and the CCD technology is mature and well developed. One big drawback with CCD's is that the technique for producing CCD's is incompatible with other integrated circuit technology such as MOS and CMOS technology, so that processing circuits and the CCD arrays must be produced on chips separate from the CCD's. Another drawback is that the CCD sensors consume large amounts of energy (as compared to cameras with CMOS sensors) and require high rail-to-rail voltage swings to operate CCD. This can pose problems for today's mobile appliances, such as Cellular Phone and Personal Digital Assistant.

Another currently available type of image sensors is based on metal oxide semiconductor (MOS) technology or complementary metal oxide semi-conductor (CMOS) technology. These sensors are commonly referred to as CMOS sensors. CMOS sensors have multiple transistors within each pixel. The most common CMOS sensors have photo-sensing circuitry and active circuitry designed in each pixel cell. They are called active pixel sensors. The active circuitry consists of multiple transistors that are inter-connected by metal lines; as a result, this area is opaque to visible light and cannot be used for photo-sensing. Thus, each pixel cell typically comprises a photosensitive region and a non-photosensitive region. In efforts to minimize this problem and to increase the exposure in the photo-sensitive region of each pixel, it is a known practice to utilize micro-lens arrays with a micro-lens positioned over each pixel directing light, which would otherwise illuminate an opaque region, onto the photosensitive region of the pixel. In these conventional CMOS design, the photodiode area is typically only about 30% of the total pixel area and the rest of the 70% are used for pixel circuit. This 30% is called fill-factor. Practitioners in the industry have found that a hemispherical shape structure made of transparent polymer can gear the light into the photodiode area and in effect increase the fill-factor by two to about 60%.

Attempts have been made to produce small visible light cameras using CMOS sensors on the same chip with processing circuits. One such attempt is described in recently issued U.S. Pat. No. 6,486,503. Small cameras using CMOS sensors typically use less energy than CCD sensors and may provide a solution for energy consumption; but the traditional CMOS-based small cameras suffer low light sensing performance, which is intrinsic to the nature of CMOS active pixel sensors caused by shallow junction depth in the silicon substrate and its active transistor circuitry taking away the real estate preciously needed for photo-sensing.

U.S. Pat. Nos. 5,528,043 5,886,353, 5,998,794 and 6,163,030 are examples of prior art patents utilizing CMOS circuits for imaging which have been licensed to Applicants' employer. U.S. Pat. No. 5,528,043 describes an X-ray detector utilizing a CMOS sensor array with readout circuits on a single chip. In that example image processing is handled by a separate processor (see FIG. 4 which is FIG. 1 in the '353 patent. U.S. Pat. No. 5,886,353 describes a generic pixel architecture using a multi-layer hydrogenated amorphous silicon layer structure, either p-i-n or p-n or other derivatives deposited on top of an array of CMOS pixel circuits. This architecture is referred to a "photoconductor on active pixels" (POAP). U.S. Pat. Nos. 5,998,794 and 6,163,030 describe various ways of making electrical contact to the underlying CMOS circuits in a pixel in a POAP architecture. All of the above US patents are incorporated herein by reference.

An important advantage of the POAP structure is that the photodiode portion of each pixel in the pixel array, which may be many thousands or millions of pixels, can be laid down on top of the pixels in a continuous process as a non-segmented continuous multilayer photodiode layer. This greatly simplifies sensor fabrication. However, this architecture also permits in some cases charges produced by photons in the region above one pixel to drift or be attracted to a collection electrode of a neighboring pixel. This is more likely to happen toward the end of a charge integration period when the potential across a highly illuminated pixel is reduced compared to a much more lightly illuminated neighboring pixel where the potential would have remained close to a reset potential. This problem is referred to in the sensor industry as "crosstalk". One of the biggest challenges in using POAP technology is to avoid pixel-to-pixel cross talk without pixel patterning of the photo-sensing layers. This challenge becomes more difficult as the pixel size decreases, especially when the sizes decrease below about 3 microns.

A need exists for improved camera technology which can provide electronic cameras with pixel sizes in the range of 3 microns and smaller with minimum pixel-to-pixel crosstalk.

SUMMARY OF THE INVENTION

The present invention provides a MOS or CMOS sensor with a multi-layer photodiode layer covering an array of active pixel circuits. The multi-layer photodiode layer of each pixel is fabricated as continuous layers of charge generating material on top of the MOS and/or CMOS pixel circuits so that extremely small pixels are possible with almost 100 percent packing factors. The sensor includes special features to minimize or eliminate pixel to pixel crosstalk. A micro-lens array with a micro-lens positioned above each pixel directs light illuminating the pixel toward the central portion of the pixel and away from its edges. Also, preferably carbon is added to doped amorphous silicon N or P bottom layer of the multi-layer photodiode layer to increase the electrical resistivity in the bottom layer to further discourage crosstalk. In preferred embodiments each of the pixels define a tiny surface area equal to or larger than about 3.24 square microns and smaller than or equal to about 25 square microns. Detailed descriptions are provided for two general types of sensors. The first type has a pixel count of about 0.3 to 1.9 million pixels and are especially suited for uses such as cell phone and video cameras. The second type with pixel count of between about 1.9 million pixels to more than 5 million pixels is especially suited for digital still cameras.

Use of the microlens array permits a reduction in pixel size that in turn permits very large increases in the number of pixels without increasing the size of the pixel array. In preferred embodiments the pixel size is reduced from 3 microns to 1.8 microns permitting an increase in the pixel count in a 4.8 mm×3.6 mm array from 1,920,000 pixels to 5,334,000 pixels. Proposed standard sizes are 2.2 microns, and 1.8 microns.

BRIEF DESCRIPTION OF THE DRAWINGS

FIG. 3A is a partial cross-sectional diagram illustrating pixel cell architecture for five pixels of a sensor array utilizing principles of the present invention.

FIG. 8 shows a digital signal processing chain.

FIG. 9 shows the checkerboard color filter array.

FIGS. 10A and 10B show importance of a highly resistive bottom photo-diode layer.

DETAILED DESCRIPTION OF A PREFERRED EMBODIMENT

Figure 1C:
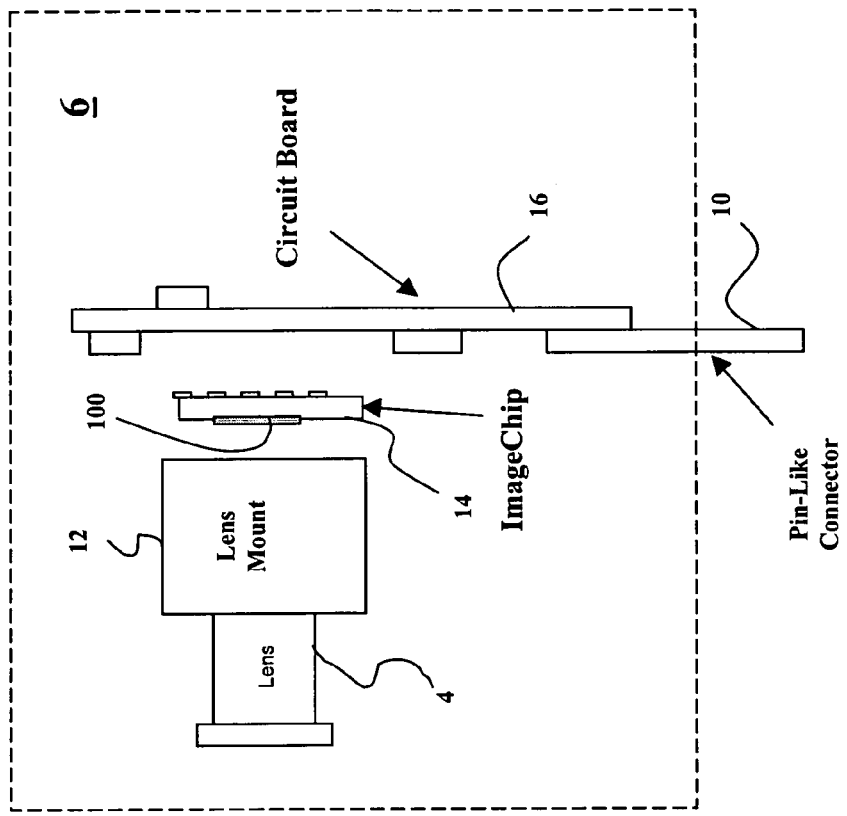
FIG. 1C shows some details of the camera.

In the following description of preferred embodiments, reference is made to the accompanying drawings, which form a part hereof, and which show by way of illustration a specific embodiment of the invention. It is to be understood by those of working skill in this technological field that other embodiments may be utilized, and structural, electrical, as well as procedural changes may be made without departing from the scope of the present invention.

Need to Avoid Crosstalk

CMOS sensors having a multi-layer photodiode layer covering an array of active pixel circuits are described in detail in the parent patent applications listed in the first sentence of this specification. This architecture permits pixel designs with extremely small pixels (measured in microns) with almost 100 percent packing factors. A potential problem with this architecture is the possibility of crosstalk. Charges generated above a particular pixel circuit in the multilayer photodiode layer can be drawn to a neighbor circuit as electrical potentials among the pixels vary during charge collection periods.

Techniques Described in Parent Applications

Techniques are described in the parent patent applications referred to in the first paragraph of this specification to minimize crosstalk. One of the techniques is to increase the electrical resistance of the bottom photodiode layer by adding carbon to the amorphous silicon. This technique encourages the carriers generated above a particular pixel, in the intrinsic layer of the photodiode layer, to preferably flow vertically into the collection electrode of that pixel instead of the collection electrode of a neighbor pixel. Applicants have shown that this technique provides adequate results for sensor products based upon a three-transistor pixel circuit with pixel sizes as small as 5 um×5 um. In this preferred embodiment of a three-transistor pixel circuit, the charge collection electrode, charge storage node and charge sense node are all at a common electrical potential. Another technique used by Applicants to reduce crosstalk is to provide an additional transistor to the pixel (a constant gate-bias transistor) to hold the charge collection electrode at a substantial constant potential which prevents a current flow from one pixel to adjacent pixels when the adjacent pixels are at higher voltage. With this technique, the charge collection electrode and charge storage node are in effect electrically isolated. As a result of it, this constant gate-bias transistor keeps the charge collection electrodes of the "dark pixel" and "light pixel" at approximately the same potential while allowing the charge storage and sense nodes to vary in potential based on pixel illumination. Applicants have described this technique in detail in U.S. Pat. No. 6,730,914 and U.S. Pat. No. 6,809,358 both of which are patents issued from parent applications and both of which are incorporated herein by reference.

Micro-Lens Arrays to Avoid Crosstalk

However, there is a weakness to the crosstalk problem associated with the two solutions described above. The weakness of the first one (using carbon to reduce the resistance in the bottom photoconductive layer) is when the pixel shrinks smaller and smaller, the lateral electrical fields near the pixel edges between a "pixel under dark" and a "pixel under light" may be larger than the vertical electrical field inside the "pixel under light". Therefore, using a highly resistive bottom layer may not be sufficient to avoid pixel-to-pixel crosstalk since the crosstalk is happening inside the intrinsic layer near the pixel edges in this case. The weakness of the second implementation (using an additional transistor in the pixel to provide a gate bias) is that there is a need to use the smallest pixel size for sensor products with desirable compactness and cost; therefore, the extra transistor for the four-transistor pixel circuit is not desirable.

Figure 11A:
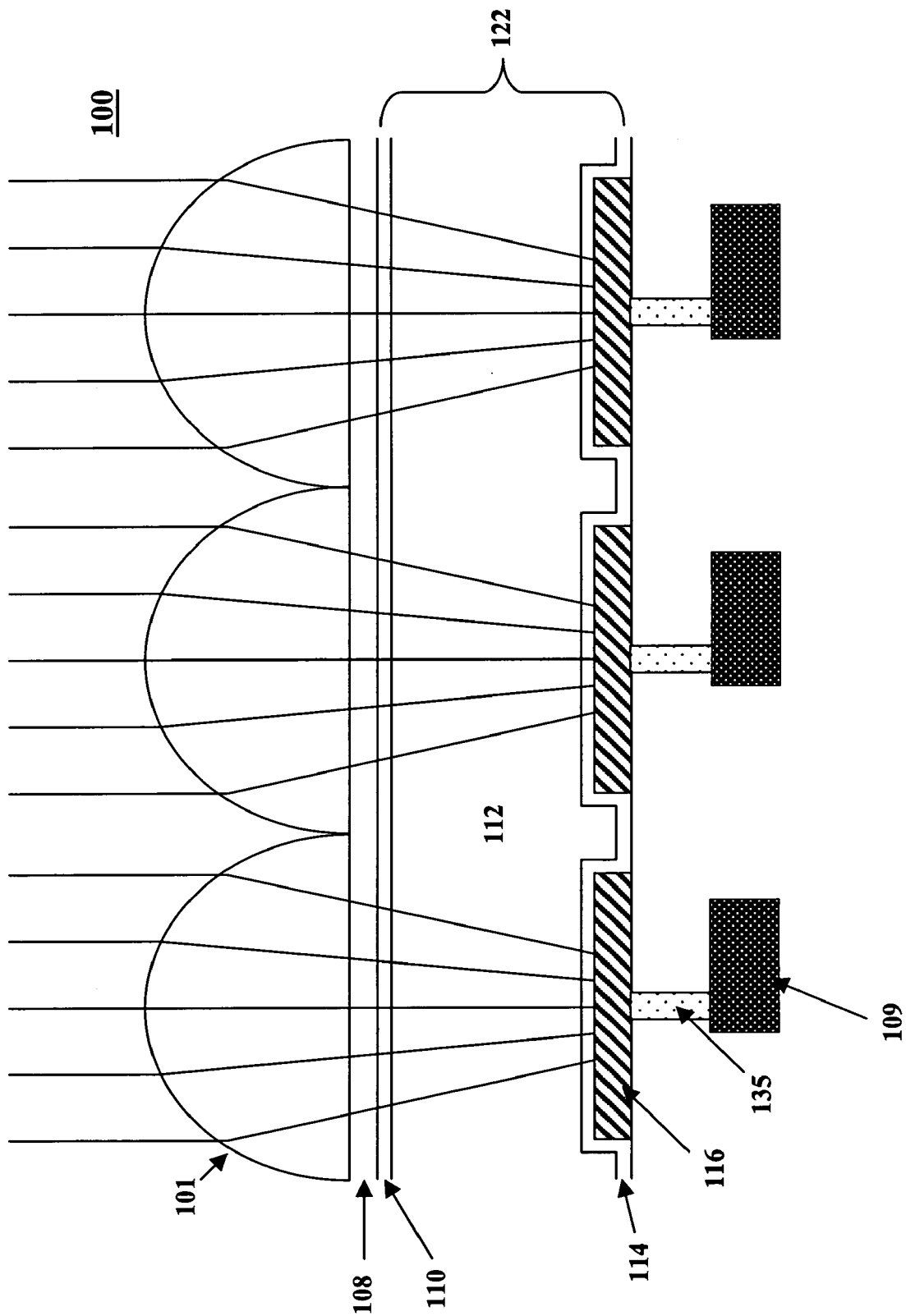
FIGS. 11A and 11B show use of a micro-lens array to reduce crosstalk.

FIG. 11A shows a new technique for minimizing or eliminating crosstalk in a CMOS sensor with multi-layer photodiode layer covering active pixel circuits. A micro-lens array is deposited on top of the multi-layer photodiode layer to focus the pixel illumination toward the central portion of the pixel and away from the edges of the pixel. FIG. 11A is only for illustration not in true scale. The micro-lenses should preferably be designed to provide minimum focal spots about half-way down in the intrinsic layer 112. The lenses are generally hemispherically shaped. Layer 108 is an ITO layer that is the transparent surface electrode of the multi-layer photodiode structure. Layer 110 represents a doped amorphous silicon layer, which can be either p-type or n-type doping. Layer 112 represents the intrinsic amorphous silicon layer and 114 is another doped amorphous silicon layer that is the opposite type from the type used in layer 108. That is, if layer 108 is p-type, then layer 114 will be n-type and vice verse. The hashed regions 116 are pixel collection electrodes made of a conducting material. In our preferred embodiment, the electrode material of choice is Titanium Nitride (TiN). The dotted regions 135 are via filled with conducting material making an electrical connection between electrode 107 and conductor 109. Conductors 109 are metal lines which are used to connect the pixel electrode 116 to other parts of the pixel circuit, not shown in this figure.

Figure 11B:
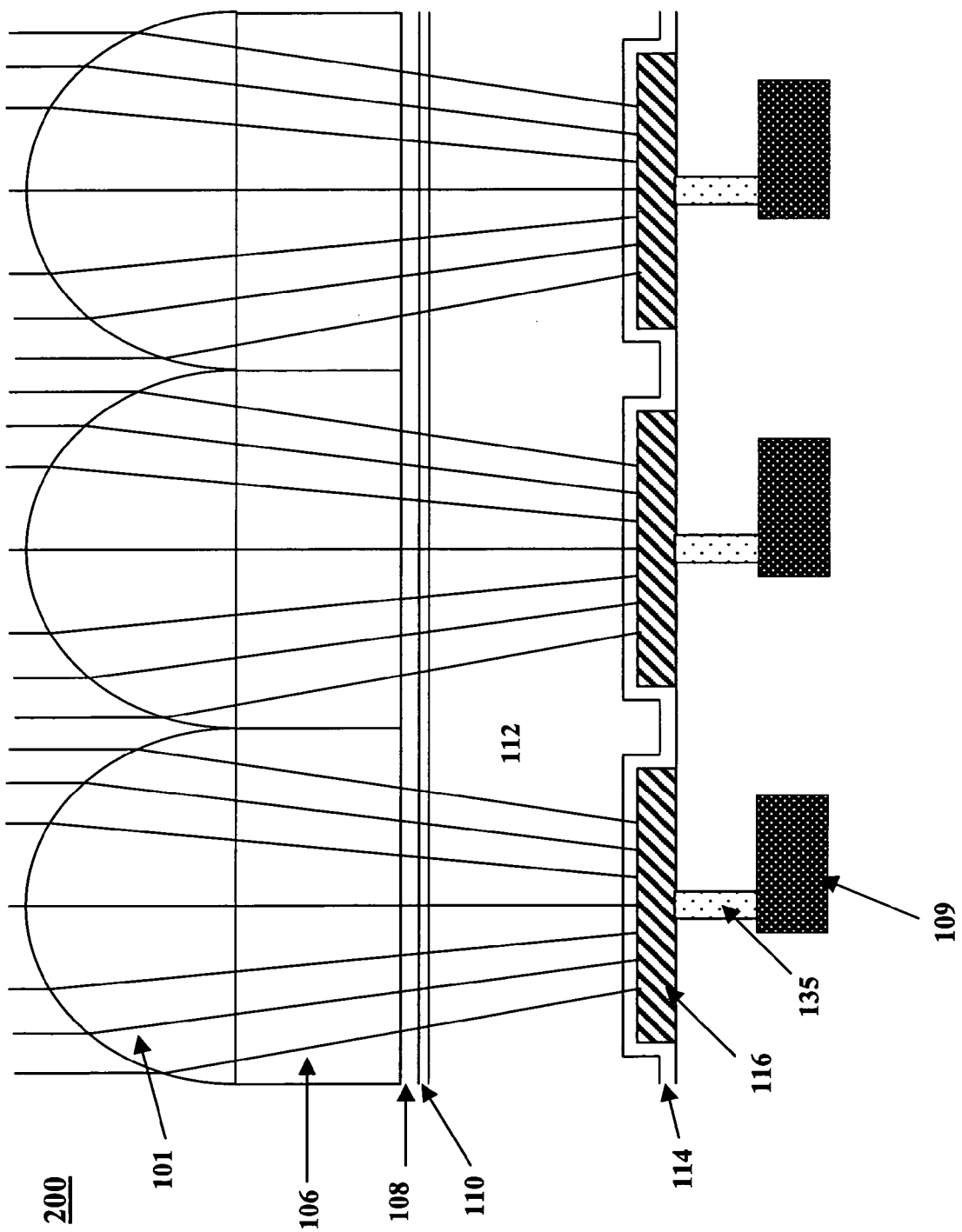

FIG. 11B is the same as FIG. 11A except a color filter layer 121 has been added. This figure is for color sensors. Additional details of the color filter layer are provided in a section below entitled "Color Filter Layer".

The addition of the micro-lens arrays to a sensor with three-micron pixels, previously designed by Applicants and described in parent applications, has permitted Applicants to reduce the sizes of the pixels to as small as 1.8 microns in preferred embodiments. With these reductions a previously described 2 mega-pixel is upgraded to a 5.3 mega-pixel sensor with no increase in sensor size. These sensors and their use in digital cameras are discussed below. Discussed in detail below are two basic sensor designs utilizing microlens arrays to reduce crosstalk. The first are very small sensors especially suited for applications such as cell phone cameras. In these preferred embodiments the pixel count is in the range of about 0.307 to 1.92 million pixels. The second general type of sensors are larger and the number of pixels is in a range from about 1.92 million pixels to more than 5 million pixels.

Tiny Sensors with 0.307 to 1.92 Million Pixels

Photoconductor on Active Pixels

Figure 1A:
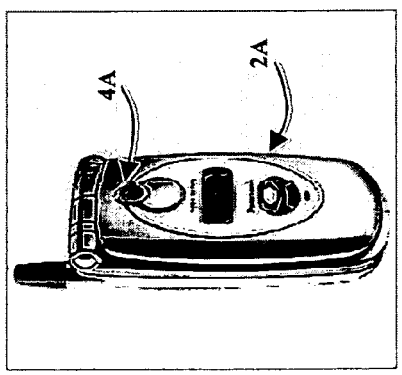
FIGS. 1A and 1B are drawings of cellular phones with equipped with a camera utilizing a camera with a CMOS sensor array according to the present invention.
Figure 1B:
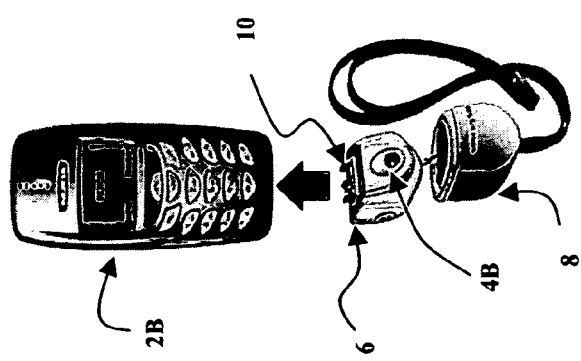

A preferred embodiment of the present invention is a single chip camera with a sensor consisting of a photodiode array consisting of photoconductive layers on top of an active array of CMOS circuits. (Applicants refer to this sensor as a "POAP Sensor" the "POAP" referring to "Photoconductor On Active Pixel".) In this sensor there are 307,200 pixels arranged in as a 640×480 pixel array and there is a transparent electrode on top of the photoconductive layers. The pixels are 5 microns×5 microns and the packing fraction is approximately 100 percent. The active dimensions of the sensor are 3.2 mm×2.4 mm and a preferred lens unit is a standard lens with a ¼.5 inch optical format. A preferred application of the camera is as a component of a cellular phone as shown in FIGS. 1A and 1B. In the 1A drawing the camera is an integral part of phone 2A. The lens is shown at 4A. In the 1B drawing the camera 6 is separated from the phone 2B and connected to it through the 3 pin-like connectors 10. The lens of the camera is shown at 4B and a camera protective cover is shown at 8. FIG. 1C is a block diagram showing the major features of the camera 4B shown in FIG. 1B drawing. They are lens 4, lens mount 12, image chip 14, sensor pixel array 100, circuit board 16, and pin-like connector 10.

CMOS Circuits

The sensor section is implemented with a photoconductor on active pixel array, readout circuitry, readout timing/control circuitry, sensor timing/control circuitry and analog-to-digital conversion circuitry. The sensor includes:

1) a CMOS-based pixel array comprised 640×480 charge collectors and 640×480 CMOS pixel circuits and
2) a CMOS readout circuit.

The sensor array is similar to the visible light sensor array described in U.S. Pat. No. 5,886,353 (see especially text at columns 19 through 21 and FIG. 27) that is incorporated by reference herein. Details of various sensor arrays are also described in the parent patent applications referred to in the first sentence of this specification all of which have also been incorporated herein by reference. FIGS. 2, 3A, 3B and 3C describe features of a preferred sensor array for this cell phone camera. The general layout of the sensor is shown at 100 in FIG. 2. The sensor includes the pixel array 102 and readout and timing/control circuitry 104. FIG. 3A is a drawing showing the layered structure of a 5 pixel section of the pixel array.

Color Filter Layer

The sensor array is coated with color filters and each pixel is coated with only one color filter to define only one component of the color spectrum. The preferred color filters set is comprises three broadband color filters with peak transmission at 450 nm (B), 550 nm (G) and 630 nm (R). The full width of half maximum of the color filters is about 50 nm for Blue and Green filters. The Red filter typically has transmission all the way into near infrared. For visible image application, an IR cut-off filter needs to be used to tailor the Red response to be peaked at 630 nm with about 50 nm full width of half maximum. These filters are used for visible light sensing applications. Four pixels are formed as a quadruplet, as shown in FIG. 3C. Two of the four pixels are coated with color filter of peak transmission at 550 nm, they are referred as "Green pixels". One pixel is coated with color filter with peak at 450 nm (Blue pixel) and one with filter peaked at 630 nm (Red pixel). The two Green pixels are placed at the upper-right and lower-left quadrants. A Red pixel is placed at the upper-left quadrant and a Blue pixel is placed at lower-right quadrant. The color-filter-coated quadruplets are repeated for the entire 640×480 array.

FIG. 3A shows a top filter layer 106 in which the green and blue filters alternate across a row of pixels. Beneath the filter layer is a transparent surface electrode layer 108 comprised of about 0.06 micron thick layer of indium tin oxide which is electrically conductive and transmissive to visible light. Below the conductive surface electrode layer is a photoconductive layer comprised of three sub-layers. The uppermost sub-layer is an about 0.005 micron thick layer 110 of n-doped hydrogenated amorphous silicon. Under that layer is an about 0.5 micron layer 112 of un-doped hydrogenated-amorphous silicon. This 112 layer is referred to by Applicants as an "intrinsic" layer. This intrinsic layer is the one that displays high electrical resistivity unless it is illuminated by photons. Under the un-doped layer is a high-resistivity P-doped hydrogenated-amorphous silicon bottom layer 114 that is about 0.01 micron thick. These three hydrogenated amorphous silicon layers produce a diode effect above each pixel circuit. Applicants refer to the combination of the above three layers as an N-I-P photoconductive layer. If the bottom layer is made of high-resistivity N-doped hydrogenated-amorphous silicon, the Applicants refer such layers as P-I-N photoconductive layer.

Carbon atoms or molecules are preferably added to bottom P-doped layer 114 to increase electrical resistance. This helps to minimize the lateral crosstalk among pixels through the bottom layer and avoids loss of spatial resolution. It also helps avoid any adverse electrical effects at the edge of the pixel array where the transparent electrical layer makes contact with the bottom layer 114 as shown in FIG. 10A. This N-I-P photoconductive layer is not lithographically patterned, but (in the horizontal plane) is a homogeneous film structure. This simplifies the manufacturing process. Within the sub-layer 114 are 307,200 4.6×4.6 micron electrodes 116 which define the 307,200 pixels in this preferred sensor array. Electrodes 116 are made of Titanium Nitride. Just below the electrodes 116 are CMOS pixel circuits 118. The components of pixel circuits 118 are described by reference to FIG. 3B. The CMOS pixel circuits 118 utilize three transistors 250, 248 and 260. The operation of a similar three transistors pixel circuit is described in detail in U.S. Pat. No. 5,886,353. This circuit is used in this embodiment to achieve maximum saving in chip area. Other more elaborate readout circuits are described in the parent patent applications referred to in the first sentence of this specification. Pixel electrode 116, shown in FIG. 3A, is connected to the charge-collecting node 120 as shown in FIG. 3B. Pixel circuit 118 includes charge collection node 120, collection capacitor 246, source follower buffer 248, selection transistor 260, and reset transistor 250. Pixel circuit 118 uses p-channel transistors for reset transistor 250 and an n-channel transistor for source follower transistor 248 and selection transistor 260. The voltage at COL (out) 256 is proportional to the charge Q(in) stored on the collection capacitor 246. By reading this node twice, once after the exposure to light and once after the reset, the voltage difference is a direct proportional to the amount of light being detected by the Photo-sensing structure 122. Pixel circuit 118 is referenced to a positive voltage Vcc at node 262 (typically 2.5 to 5 Volts). Pixel circuitry for this array is described in detail in the '353 patent.

Micro-Lens Array

This sensor also includes a micro-lens array 101 as described above to focus the incoming light toward the center of intrinsic layer 112. Such micro-lens is to reduce the potential crosstalk inside the intrinsic layer. In many applications, there is no need for such micro-lens array and the crosstalk reducing features by the increased resistance of the bottom photodiode layer as described above has been proven sufficient to achieve acceptable crosstalk. However, for applications requiring super sharpness, the use of micro-lens provides significant improvement in sharpness, especially in pixel size smaller than 3 microns. In the preferred embodiment of the 1.8 micron pixel size use of this micro-lens array eliminates crosstalk, especially when combined with the crosstalk reducing features of the increased resistance of the bottom photodiode layer by the addition of carbon as described above.

Other Camera Features

Figure 2:
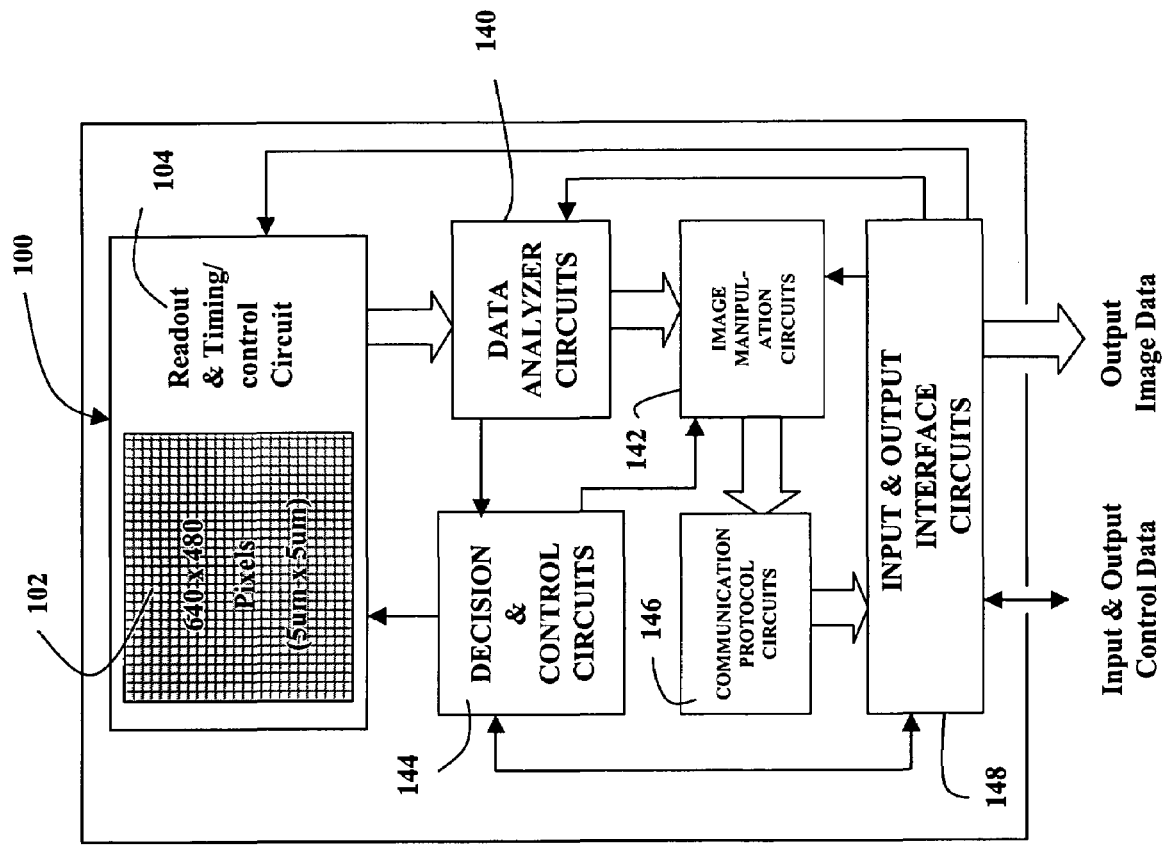
FIG. 2 shows some details of a CMOS integrated circuit utilizing some of the principals of the present invention.
Figures 3B, 3C:
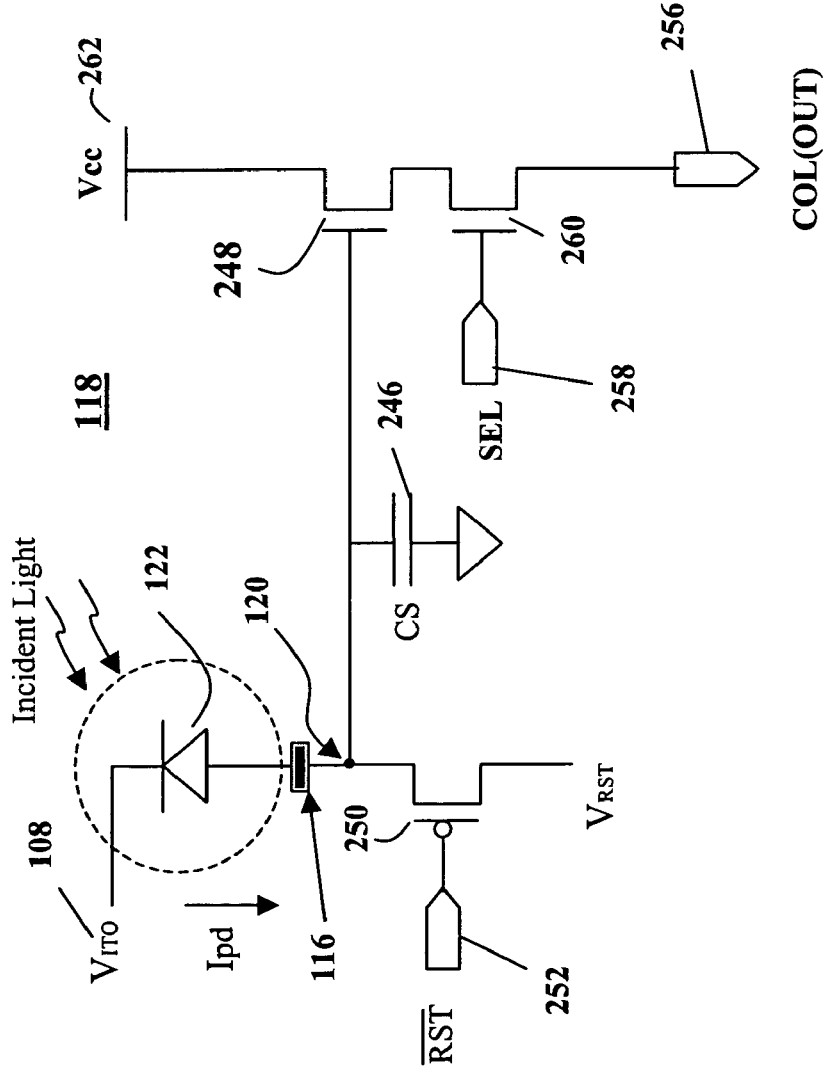
FIG. 3B shows CMOS pixel circuitry for a single pixel.
FIG. 3C shows a color filter grid pattern.

In this preferred embodiment, as shown in FIG. 2 additional MOS or CMOS circuits for converting the charges into electrical signal, for amplifying the signals, for converting analog signal into digital signal and for digital signal processing are provided on the same crystalline substrate utilized for the collection of the charges. The data out of the sensor section 100 is in digital form and with a pixel-sequential stream. The sensor chip area includes a standard clock generation feature (not shown here but described in the '353 patent). From it, signals representing the start of frame, start of line, end of a frame, end of line and pixel are distributed into all sections on the image chip to synchronize the data flow.

Environmental Analyzer Circuits

The data out of the sensor section is fed into an environmental analyzer circuit 140 where image's statistics is calculated. The sensor region is preferably partitioned into separate sub-regions, with the average or mean signal within the region being compared to the individual signals within that region in order to identify characteristics of the image data. For instance, the following characteristics of the lighting environment are measured:

1. light source brightness at the image plane
2. light source spectral composition for white balance purpose
3. imaging object reflectance
4. imaging object reflectance spectrum
5. imaging object reflectance uniformity The measured image characteristics are provided to decision and control circuits 144. The image data passing through an environmental analyzer circuit 140 are preferably not be modified by it at all. In this embodiment, the statistics include the mean of the first primary color signal among all pixels, the mean of the second primary color signal, the mean of the third primary color signal and the mean of the luminance signal. This circuit will not alter the data in any way but calculate the statistics and pass the original data to image manipulation circuits 142. Other statistical information, such as maximum and minimum will be calculated as well. They can be useful in terms of telling the range of the object reflectance and lighting condition. The statistics for color information is on full image basis, but the statistics of luminance signal is on a per sub-image regions basis. This implementation permits the use of a weighted average to emphasize the importance of one selected sub-image, such as the center area.

Decision & Control Circuits

The image parameter signals received from the environmental analyzer 140 are used by the decision and control circuits 144 to auto-exposure and auto-white-balance controls and to evaluate the quality of the image being sensed, and based on this evaluation, the control module (1) provide feedback to the sensor to change certain modifiable aspects of the image data provided by the sensor, and (2) provide control signals and parameters to image manipulation circuits 142. The change can be sub-image based or full-image based. Feedback from the control circuits 144 to the sensor 100 provides active control of the sensor elements (substrate, image absorption layer, and readout circuitry) in order to optimize the characteristics of the image data. Specifically, the feedback control provides the ability to program the sensor to change operation (or control parameters) of the sensor elements. The control signals and parameters provided to the image manipulation circuits 142 may include certain corrective changes to be made to the image data before outputting the data from the camera.

Image Manipulation Circuits

Image manipulation circuit 142 receives the image data from the environmental analyzer and, with consideration to the control signals received from the control module, provides an output image data signal in which the image data is optimized to parameters based on the control algorithm. In these circuits, pixel-by-pixel image data are processed so each pixel is represented by three color-primaries. Color saturation, color hue, contrast, brightness can be adjusted to achieve desirable image quality. The image manipulation circuits provide color interpolation between each pixel and adjacent pixels with color filters of the same kind so each pixel can be represented by three-color components. This provides enough information with respect to each pixel so that the sensor can mimic human perception with color information for each pixel. It further does color adjustment so the difference between the color response of sensors and human vision can be optimized.

Communication Protocol Circuits

Communication protocol circuits 146 rearrange the image data received from image manipulation circuits to comply with communication protocols, either industrial standard or proprietary, needed for a down-stream device. The protocols can be in bit-serial or bit-parallel format. Preferably, communication protocol circuits 146 convert the process image data into luminance and chrominance components, such as described in ITU-R BT.601-4 standard. With this data protocol, the output from the image chip can be readily used with other components in the market place. Other protocols may be used for specific applications.

Input & Output Interface Circuits

Input and output interface circuits 148 receive data from the communication protocol circuits 146 and convert them into the electrical signals that can be detected and recognized by the down-stream device. In this preferred embodiment, the input & output Interface circuits 148 provide the circuitry to allow external to get the data from the image chip, read and write information from/to the image chip's programmable parametric section.

Chip Package

The image chip is packaged into an 8 mm×8 mm plastic chip carrier with glass cover. Depending upon the economics and applications, other type and size of chip carrier can be used. Glass-cover can be replaced by other type of transparent materials as well. The glass cover can be coated with anti-reflectance coating, and/or infrared cut-off filter. In an alternative embodiment, this glass cover is not needed if the module is hermetically sealed with a substrate on which the image chip is mounted, and assembled in a high quality clean room with lens mount as the cover.

The Camera

Lens 4 shown in FIG 1C is based on a ¼.5" F/2.8 optical format and has a fixed focal length with a focus range of 3–5 meters. Because of the smaller chip size, the entire camera module can be less than 10 mm (Length)×10 mm (Width)× 10 mm (Height). This is substantially smaller than the human eyeball! This compact module size is very suitable for portable appliances, such as cellular phone and PDA. Lens mount 12 is made of black plastic to prevent light leak and internal reflectance. The image chip is inserted into the lens mount with unidirectional notches at four sides, so to be provided a single unit once the image chip is inserted in and securely fastened. This module has metal leads on the 8 mm×8 mm chip carrier that can be soldered onto a typical electronics circuit board.

Examples of Feedback & Control

Camera Exposure Control:

Sensor 100 can be used as a photo-detector to determine the lighting condition. Since the sensor signal is directly proportional to the light sensed in each pixel, one can calibrate the camera to have a "nominal" signal under desirable light. When the signal is lower than the "nominal" value, it means that the ambient "lighting level" is lower than desirable. To bring the electrical signal back to "nominal" level, the pixel exposure time to light and/or the signal amplification factor in sensor or in the image manipulation module are automatically adjusted. The camera may be programmed to partition the full image into sub-regions is to be sure the change of operation can be made on a sub-region basis or to have the effect weighted more on a region of interest.

Camera White Balance Control:

The camera may be used under all kind of "light sources". Each light source has different spectral distribution. As a result, the signal out of the sensor will vary under different "light source". However, one would like to make the image visualized similarly when displayed on a visualizing device, such as print paper or CRT display. It means that a typical light source (day light, flash light, tungsten light bulb, etc) needs to be perceived as a white object more or less. Since the sensor has pixels covered with primary color filters, one can then determine the relative intensity of the light source from the image data. The environmental analyzer is to get the statistics of the image and determine the spectral composition and make necessary parametric adjustment in sensor operation or Image Manipulation to create a signal that can be displayed as "white object" when perceived by human.

Mega-Pixel Sensors with 1.92 to 5.3 Million Pixels

Other preferred embodiments of the present invention, which includes a type of mega pixel sensors that can be described by reference to FIGS. 4A through FIG. 9.

Two Million Pixel Sensor

Figure 4A:
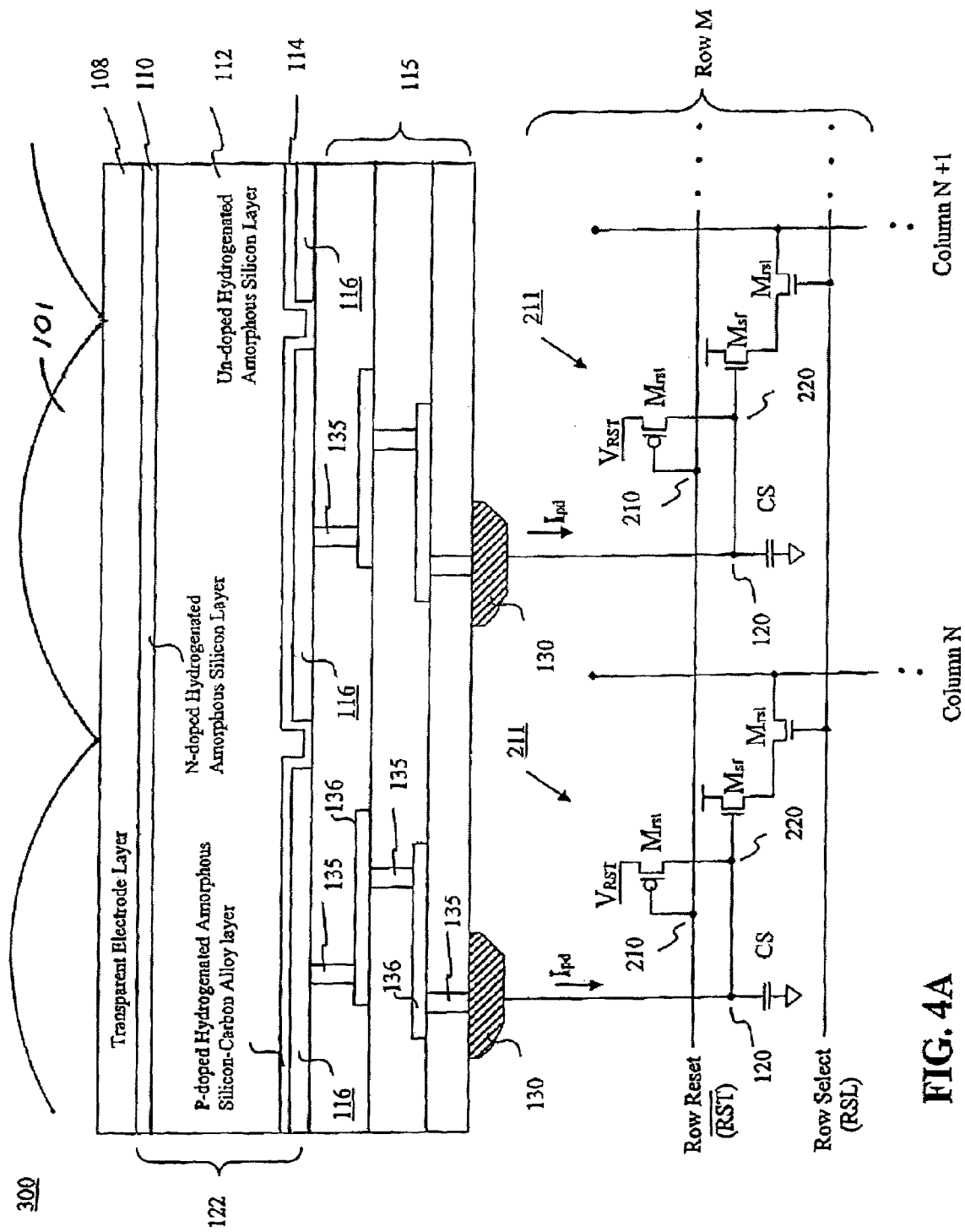
FIGS. 4A, B and C show features of a 2 million pixel sensor.
Figure 4B:
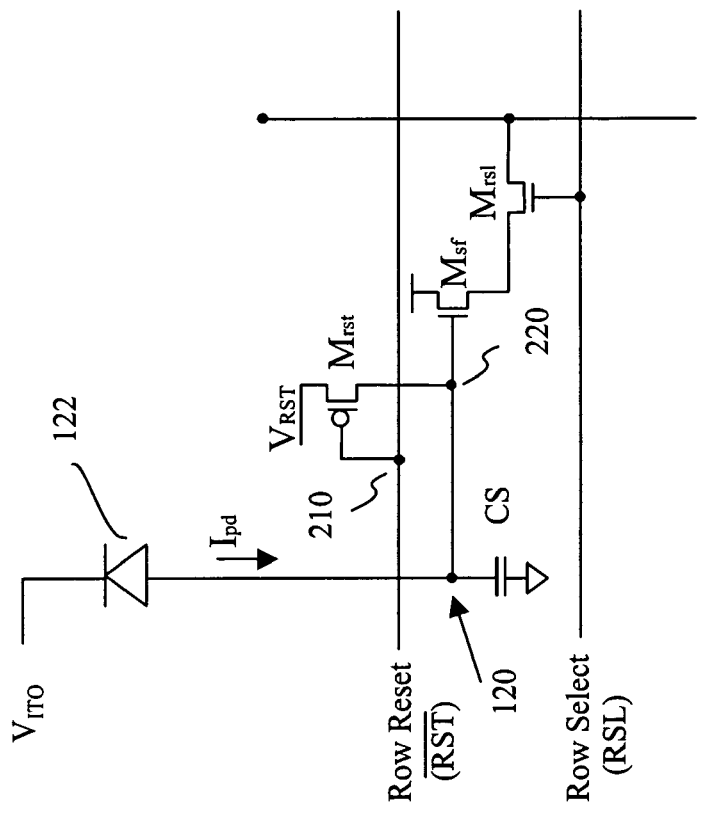
Figure 5:
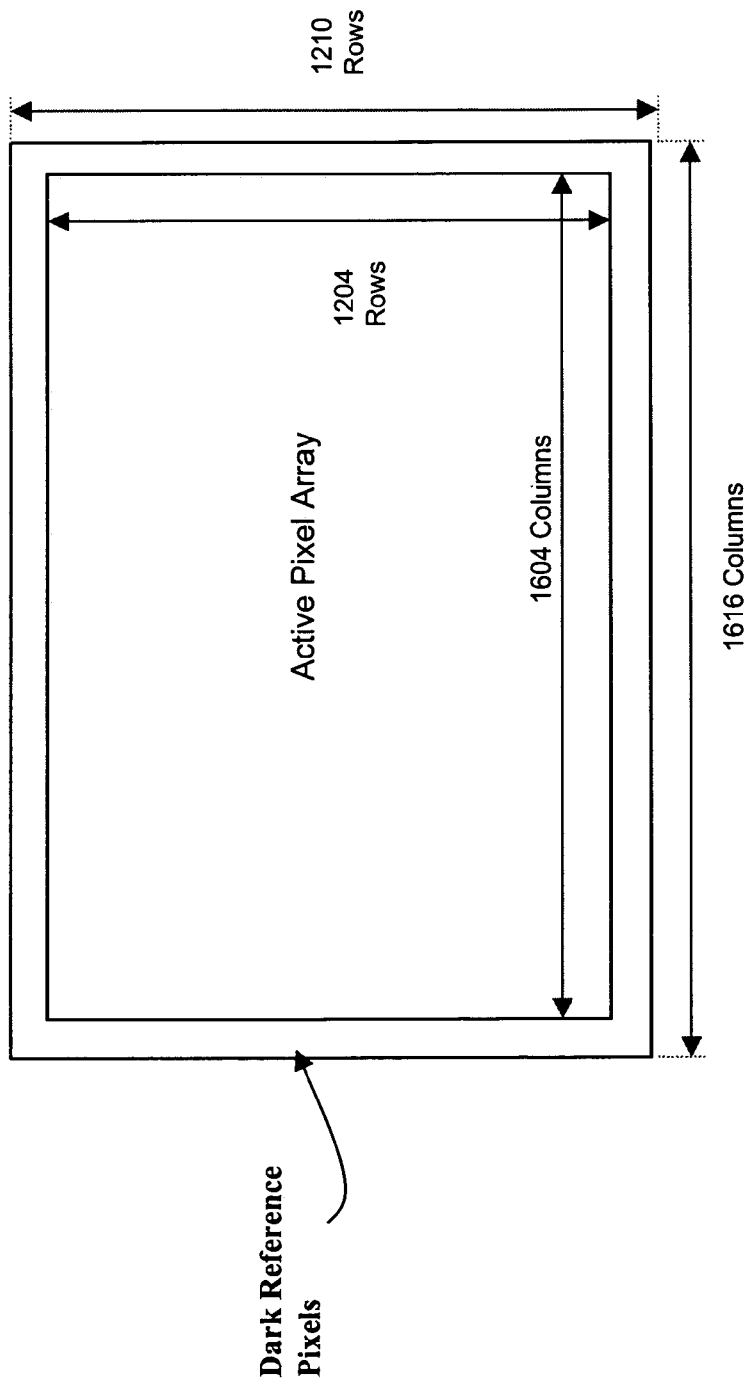
FIG. 5 shows a pixel array layout for the 2 million pixel sensor.

An approximately two-million pixels cell array and related circuitry, with 3-micron pixels and a 9 square microns surface area, is shown in FIG. 4A. A preferred pixel configuration of 1204 rows and 1604 columns is shown in FIG. 5. This sensor is well suited for producing images for high definition television. In general, the individual pixels are very similar to the pixels in the first preferred embodiment. The transistor portions of the pixels are shown at 211 as integrated circuits in electrical schematic form in FIG. 4A. FIG. 4B is an electrical schematic drawing showing the transistor portion of the pixel circuit and the photodiode portion of the pixel, all in schematic form. These integrated pixel circuits are produced in and on a silicon substrate using standard CMOS techniques. The various photodiode portions of each pixel are laid down in continuous layers on top of the integrated circuits and are shown in FIG. 4A as actual layers. Each pixel comprises an impurity-doped diffusion region 130 that is a portion of the reset transistor $M_{rst}$ and represents a part of the charge collection node 120 as shown in FIG. 4B.

The array includes an interconnect structure 115 comprised of dielectric layers providing insulation and electrical interconnections of various elements of the pixel cell array. These interconnections include a set of via 135 and metalized regions 136 for each pixel connecting diffusion region 130 with a patterned electrode pad 116 formed on top of the interconnect structure 115. Interconnect structure 115, and metalized regions 136 and vias 135 are produced using standard CMOS fabrication techniques. In the standard CMOS fabrication process, metal lines are formed of Aluminum layers. Because Aluminum has very high diffusivity with amorphous silicon, Applicants' embodiment has 116 made of Titanium Nitride without the top Aluminum layer. This finding is essential to make Applicants' sensor work. Of course other metals, such as Titanium, Tungsten, Titanium-Tungsten alloy and Tungsten Nitride, can be used as well. But Titanium Nitride is readily available in a typical CMOS process; therefore, it is Applicants' preferred material.

Each pixel includes a N-I-P photodiode portion formed by continuous layers laid down on top of the interconnect structure 115 and patterned electrode pads 116. The lowest of the photodiode layers, layer 114, is about 0.01 micron thick and is comprised of P-doped hydrogenated amorphous silicon. As in the first preferred embodiment, carbon is preferably added to this layer at concentrations between about 5 to 35 percent. (Carbon concentrations as high as 50 percent could be used. In prototype devices actually built and tested by Applicants, the carbon concentration was about 30 percent.) Applicants have discovered that carbon doping at this concentration does not significantly adversely affect the quality of this layer as a p-type semiconductor but does substantially increase the electrical resistivity of the layer. This issue is discussed in more detail below. The next higher layer, layer 112 is the intrinsic layer of the N-I-P photodiode region of the array. It is hydrogenated amorphous silicon and no doping and is in this embodiment about 0.5 to 1.0 micron thick. The top photodiode layer 110 is N-doped hydrogenated amorphous silicon and is about 0.005 to 0.01 micron thick. A transparent electrode layer 108 is a layer of indium tin oxide deposited on top of N-layer 108 about 0.06 micron thick. This material is electrically conductive and also transparent to visible light.

This sensor can also include a micro-lens array 101 for further reducing crosstalk. As explained above the addition of the micro-lens array permits the pixel size to be substantially reduced without creating serious crosstalk problems. Applicants have developed preliminary designs for pixel sizes as small as 1.8 microns, and believe this technique can be applicable down to a pixel size limited only by the diffraction of the optics. This means that this size sensor could provide 5.3 millions pixel without increasing the size of the sensor.

Pixel Circuitry

The electronic components of each pixel in this embodiment are shown in FIG. 4B are the same as those shown in FIG. 3B for the 0.3 mega pixel camera. The reader is referred to the description given above with a reference to FIG. 3B for an understanding of the pixel circuitry.

Sensor Array Circuitry

Figure 4C:
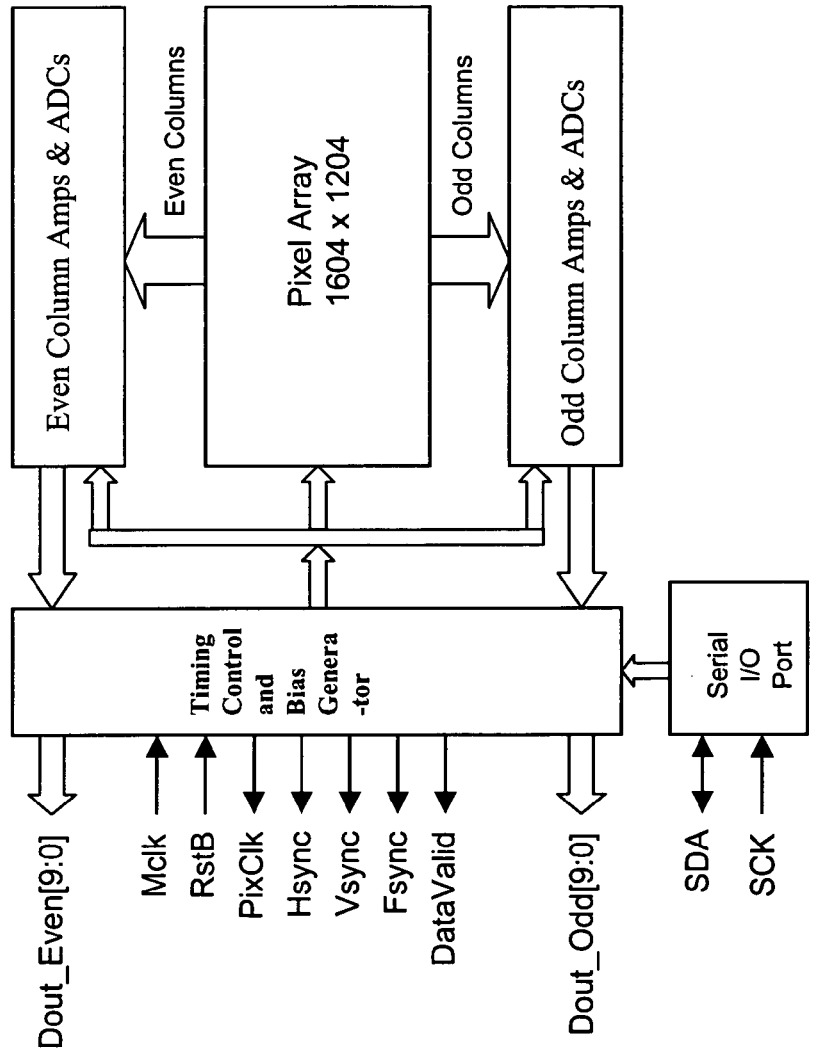
Figure 6:
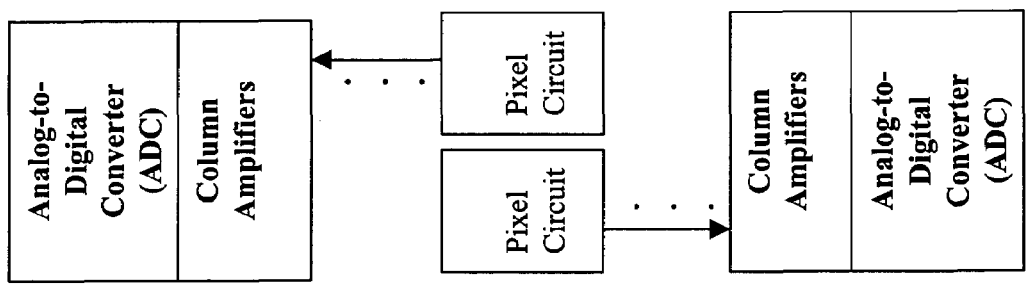
FIG. 6 shows a technique for amplifying and converting an analog sensor signal to digital data.
Figure 7:
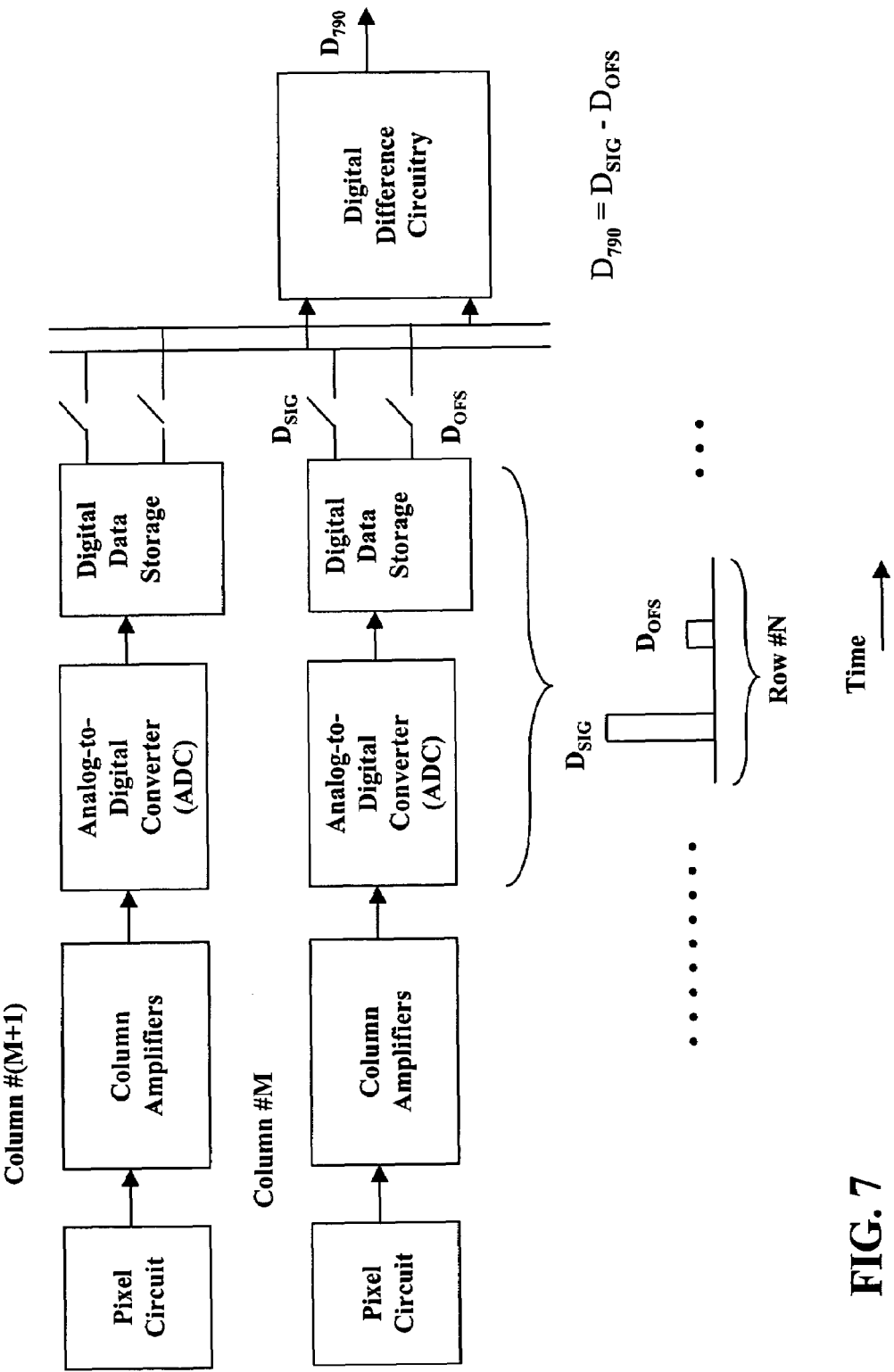
FIG. 7 shows a column-based signal chain.

A block diagram of the sensor array circuitry for the two millions plus pixel array is shown in FIG. 4C. In Applicants' 3-micron design, 1604×1204 pixels form the pixel array. This sensor design uses architecture with Column-Parallel Analog-to-Digital (ADC), where each column has its own ADC. This architecture is distinctly different from Applicants' 0.3 mega pixel sensor design, where a single ADC is used. In the single ADC design, the conversion frequency runs at the pixel clock rate. For example, in the case of 0.3 mega pixel sensor, the pixel clock rate runs at least 9 MHz to provide 30 frames-per-second video. When the pixel count becomes larger, for example in the case of 2 mega pixels, the single ADC design would require the conversion rate to run at least 60 MHz. For image sensors, typically, the ADC requires to provide 10-bits accuracy. A 10-bit and 60 MHz ADC itself requires the state-of-the-arts design, which may require fabrication beyond a typical CMOS based process. Worse than that, it generates a lot of noise and heat that affect the overall sensor performance. In contrast, Column-Parallel ADC can run at the frequency at "line rate" which, in Applicants' two millions pixel sensor, is about a factor of 1000 slower than the pixel rate. This allows Applicants to use much simpler CMOS-process-compatible ADC designs. Because of the slow conversion rate, the noise and heat can be reduced leading to better sensor performance. In FIG. 4C, the timing control and bias generator circuitry on chip generate all the timing clocks and voltages required to operate the on-chip circuitry. They are to simplify the interface between the sensor and other camera electronics, and they allow sensor users to use a single master clock and single supply voltage that are desirable features in sensor application. In Applicants' two million pixels sensor design, there are two 10-bit video output ports, as shown in FIG. 4C, Dout-Even [9:0] and Dout-Odd [9:0] representing the video output from even columns and odd columns, respectively. Not shown in the Figure is an option that allows the sensor users to select an option to use only a single 10-bit port for video output. This single port design allows Applicants to use a smaller chip carrier because at least ten I/O pins can be removed. However, to support the single-port output, Applicant needs to design a switch that multiplexes the even and odd column video to have the right sequence. This switch needs to operate at higher frequency, and possible higher noise. In some applications, users might want to use two-port output in order to reduce the noise caused by any elements running at high frequency on chip. For reasons such as these, in Applicants' embodiment the choice of single-port vs. two-ports is an option to sensor users. In Applicants' 2 mega-pixel sensor, a serial I/O port is designed to allow sensor users to read and change some of the parameters for running the sensor. Applicants' two million-pixel sensor has 1604×1204 active pixels; surrounding the active pixel region are plurality of pixels covered with visible light shield that can be used as the dark reference, shown in FIG. 5. FIG. 6 shows Applicants' design to separate the even and odd columns so one set would come from top and one set would come from the bottom. FIG. 7 shows the column-based signal chain of Applicants' two million pixels sensor design. The signal comes out of the pixel region will be hold and sample into the column amplifier circuit. In the design, sensor users are allowed to program the amplification factor depending upon the signal level. The sensor uses other on-chip intelligence to automatically change the amplification factors. At this point, the signal is still analog in nature. Then this signal goes to the column-based ADC to be converted into digital signal. In Applicants design, there are two ADC conversions, one is for the signal and another one is for the reference. Applicants call this technique Delta Double Sampling (DDS). This technique allow Applicants to remove any offset the signal may experience when its pass physically from the pixel region to ADC region. It reduces the fixed pattern noise, commonly a major weakness for CMOS-based Active Pixel Sensor (APS). After DDS, the offset-cancelled digital signal is fetched into the digital signal processing chain, shown in FIG. 8. The signal goes into the Global Offset and Gain Adjustment Circuit (GOGAC) and Dark Reference Average Circuit (DRAC) at the same time. The DRAC circuit calculates the average in the dark reference pixel region, which can provide the signal level representing Dark. In the GOGAC circuit, the gain and offset are applied to the incoming digital signal. After that the digital signal is fetched into the White Balance Offset and Gain Adjustment Circuit (WBOGAC). WBOGAC applies a separate gain and offset according to the color filter the pixel is covered with. The purpose of it is to achieve a white-balanced signal under various light-sources. The parameters can be programmed in by the sensor users or by the on-chip intelligence.

Thickness of ITO Surface Electrode Layer

The thickness of the indium tin oxide (ITO) layer (the transparent surface electrode) is preferably thick enough so that (1) it can hold the characteristics of a homogenous film, (2) it can result in negligible voltage drop across the ITO layer vertically, (3) it also provides negligible voltage drop in the ITO layer in the horizontal directions. These three considerations are mainly to achieve good electrical properties. However, this transparent surface electrode layer is also the front surface of the sensor in the optical path. Therefore, one needs to optimize its properties so it also provides the desirable optical properties. In addition to using the transparent nature of the material for incoming light of wavelength within the range of interest, the thickness also is preferably chosen to achieve minimum front surface reflection and maximum transmission into photodiode layers, for light at wavelengths within the range of interest. For cameras that are designed for viewing with visible light the wavelength near the center of the visible spectrum is about 550 nm. Thin film techniques for minimizing reflection are well known and optics programs are available for designing thin films for minimizing surface reflection based on known values of index of refraction and film thicknesses. Absorption in the ITO layer increases with film thickness. Therefore, designs that provide maximum transmission of light into the photo diode layers typically will involve a tradeoff involving considerations of reflection and absorption as well as conduction across the pixel array surface. One can change ITO thickness to move this reflection/transmission optimum throughout the entire visible spectrum, from 400 nm to 700 nm, for application-specific needs.

Preferred Process for Making Photodiode Layers

In our current practice for a N-I-P diode, the P-layer, which is making contact with the pixel electrode, has a thickness of about 0.01 microns. With a pixel size of 5 microns×5 microns, the aspect ratio between the thickness and pixel width (or length) is much smaller than 1, within the P-layer the resistance along the lateral (along the pixel width/length direction) is substantially higher than the vertical direction. Because of this, the electrical carriers prefer to flow in the vertical direction than in the lateral direction. This alone may not be sufficient to ensure that the crosstalk is low enough. Therefore, Applicants prefer to increase the resistivity by introducing carbon atoms into P-layer to make it become a wider band-gap material. Our P-layer is a hydrogenated amorphous silicon layer with carbon concentration about $10^{22}$ atoms/cc. The hydrogen content in this layer is in the order of $10^{21}$–$10^{22}$ atoms/cc, and the P-type impurity (Boron) concentration in the order of $10^{20}$–$10^{21}$ atoms/cc. This results in a film resistivity of about $10^{10}$ ohm-cm. For a 5 um×5 um pixel, we have found out that negligible pixel crosstalk can be achieved even when the P-layer resistivity is down to the range of a few $10^6$ ohm-cm. Like what is described above, there is a need of engineering trade-off among P-layer thickness, carbon concentration, boron concentration and pixel size to achieve the required overall sensor performance. Therefore, the resistivity requirement may vary for other pixel sizes and configurations. For this N-I-P diode with 5 um×5 um and 3 um×3 um pixels, Applicants' I-layer is an intrinsic hydrogenated amorphous silicon with a thickness about 0.5–1 um. The N-layer is also a hydrogenated amorphous silicon layer with N-type impurity (Phosphorous) concentration in the order of $10^{20}$ to $10^{21}$ atoms/cc.

When the pixel size is reduced below 3 microns, Applicants prefer to add a micro-lens array above the top layer of the sensor. Techniques for fabricating micro-lens arrays using lithography techniques are well known and these lens arrays with dimensions in the range of 1.8 microns to 3 microns may be laid down on top of these MOS and CMOS using the same tools and processes as is used to fabricate the rest of the sensors including the pixel circuits.

For applications where the polarity of the photodiode layers are reversed and the N-layer is adjacent to the pixel electrode, the carbon atoms/molecules are added to the N-layer to reduce crosstalk and to avoid adverse electrical effects at the edge of the pixel array.

Avoiding Adverse Electrical Effects at Edge of Pixel Array

Figure 10B:
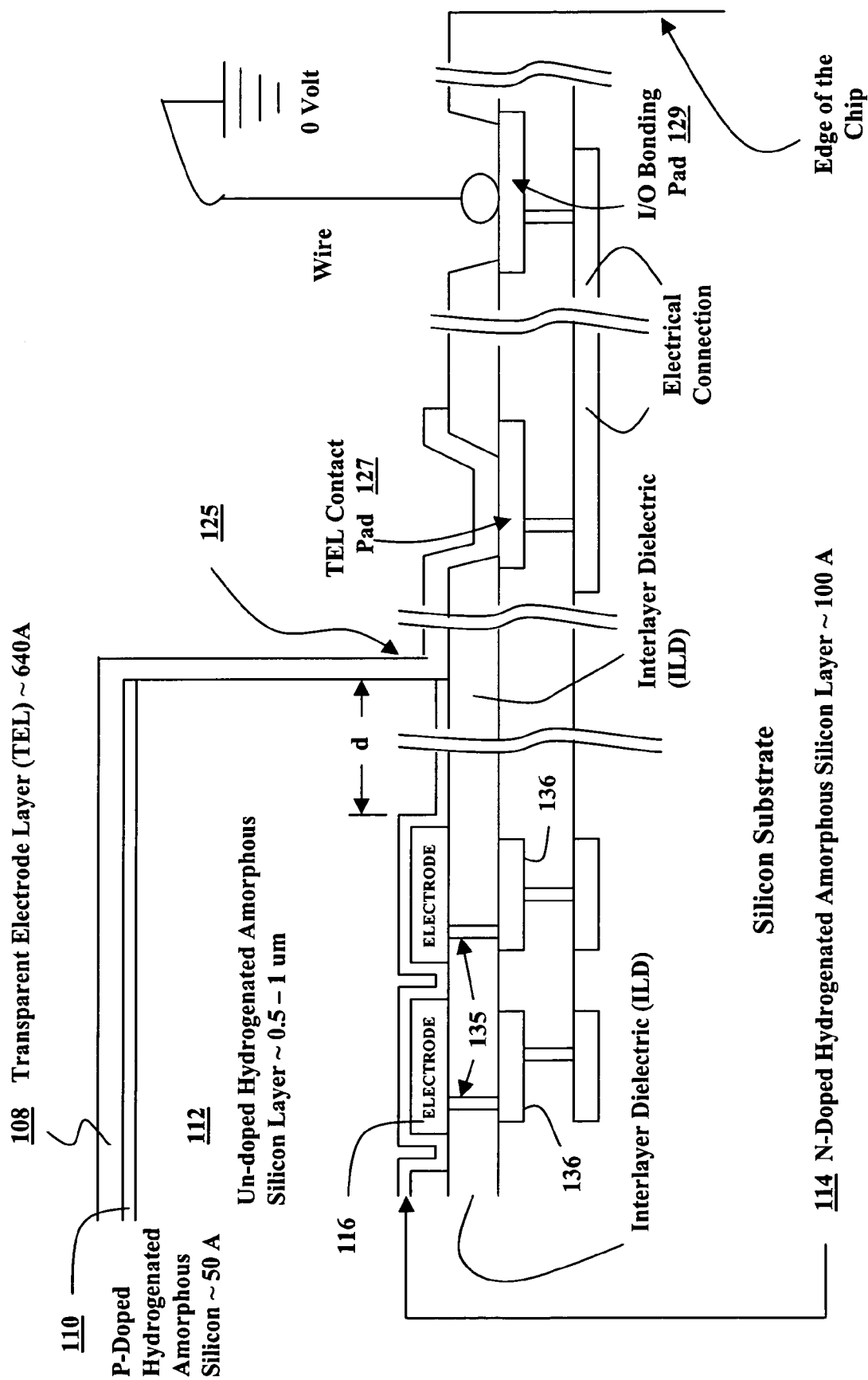

As explained above since we have carbon in the bottom layer of our photodiode to make it very resistive, contact with top transparent electrode layer 108 at the edge of the pixel array as shown at 125 in FIGS. 10A and 10B does not affect the electrical properties of the photodiode as long as the electrical resistance, from the pixel electrode to the place where transparent electrode layer 108 makes contact to the bottom photodiode layer 114, is high enough. In our case, the resistivity of the bottom layer (either n-type or p-type) is greater than $10^6$ ohm-cm. The thickness of this layer is about 0.01 um and the width of this layer is about 0.5 cm for our 1.92 million pixels sensor with 3 um pixel pitch. The typical distance between the pixel electrodes near the edge of pixel array to the location where electrode layer 108 makes contact to the bottom photodiode layer 114 is greater than 0.01 cm; therefore, the resistance is greater than $$10^6 (\text{ohm-cm}) \times 0.01 \text{cm}/(0.5 \text{cm} \times 10^{-6} \text{cm}) = 2 \times 10^{10} \text{ohm}$$

This is as resistive as most known insulators. As a result of, the image quality would not be affected.

The photodiode layers of the present invention are laid down in situ without any photolithography/etch step in between. (Some prior art sensor fabrication processes incorporate a photolithography/etch step after laying down the bottom photodiode layer in order to prevent or minimize cross talk.) An important advantage of the present process is to avoid any contamination at the junction between the bottom and intrinsic layers of the photodiode that could result from this photolithography/etch step following the laying down of the bottom layer. Contamination at this junction may result in electrical barrier that would prevent the photo-generated carriers being detected as electrical signal. Furthermore, it could trap charges so deep that cannot be recombined with opposite thermally-generated charges resulting in permanent damage to the sensor.

Once the photodiode layers are put on the CMOS wafer, a photolithography/etch step is used to open up TEL contact pads and I/O bonding pads as shown at 127 and 129 in FIGS. 10A and 10B. These pads are preferably made of metal such as aluminum. The objective of this step is to remove the photodiode layers from the chip area we do not want it to be covered by photodiode layers, including the areas for TEL contact pads and I/O bonding pads. Our preferred embodiment is, after this photolithography/etch step, just to have the photodiode layers cover the pixel array and extend out enough distance from each edge of the pixel array to avoid the adverse effect near the pixel array edges. Since these pads are larger relative to the CMOS process circuit geometry; therefore, this photolithographic/etch step is considered non-critical. In the semiconductor industry, a non-critical photographic step requires much less expensive photolithographic mask and etch processes and can be easily implemented. Once we open up the transparent electrode layer (TEL) contact pads and I/O Bonding pads, we will then deposit a homogenous ITO layer onto the entire wafer. As a result of it, the inner surface of the ITO layer 108 is making physical and electrical contact to the ITO contact pads as well as all the layers of the photodiode. Then we need to go through another non-critical photolithography/etch step to open up the I/O bonding pads. The ITO contact pad is electrically connected to a selected I/O bonding pad, which will be wire-bonded onto an integrated circuit packaging carrier that has leads. These leads of the IC packaging carrier are used to make electrical contact to other electronic components on a printed circuit board. Through this selected I/O bonding pad and the TEL contact pads, the ITO layer can then be biased to a desirable voltage externally to create an electrical field across the photodiode layers to detect photon-generated charges.

Below is a summary of the steps we make Applicants' POAP sensors on a wafer based process:

Step 1: The CMOS process is no different from the art used in the industry. We use a typical CMOS process to make the pixel array circuitry and periphery circuitry. The pixel electrode is also made as a part of the typical CMOS process.

Step 2: Deposit a-Si photodiode, all three layers (n-i-p or p-i-n), using PECVD techniques. Other techniques may be used as long as it produces good a-Si layers.

Step 3: Photolithography plus etch processes are used to open up the ITO Contact pad and I/O Bonding pads, and clear out the areas which we do not want to have them covered with a-Si.

Step 4: Deposit ITO onto wafers using sputtering equipment. However, other techniques, even other materials, may be used to put ITO layer on as long as the thickness, optical and electrical properties are re-produced.

Step 5: Photolithography plus etch processes are used to open up the I/O bonding pads and clear away unwanted ITO.

Step 6: Put on color filters and micro-lens array.

Step 7: Photolithography processes are used to open up the I/O bonding pads.

Step 8: Have the wafer diced.

Step 9: Put diced chip into a selected IC carrier or other equivalent packaging carrier, wire-bond selected Bonding pads to corresponding leads of the IC carrier.

Step 10: Seal the IC carrier with a glass cover, which is transmissive in the spectral range the sensor is used for.

Steps 2, 3, 4 and 5 in the order presented are special steps developed to fabricate chips according to the present invention. The other listed steps are processes regularly used in integrated circuit sensor fabrication. Variations in these steps can be made based on established practices of different fabrication facilities.

Specifications for the Two-Million Pixel Sensor

Applicants have built and tested a prototype two-million pixel sensor as shown in FIGS. 4A through FIG. 8. This sensor is ideally suited for use as a camera for high definition television. Other applications include: cellular phone cameras, surveillance cameras, embedded cameras on portable computers, PDA cameras and digital still cameras. Applicant's specifications for this sensor are summarized below:

1. Photo-sensing layer:
  a. P-I-N photodiode structure;
  b. P-I-N is made of hydrogenated amorphous silicon;
  c. P-I-N layers are un-patterned;
  d. a surface electrode layer covers over the P-I-N layer structure;
  e. the surface electrode layer is un-patterned;
  f. the surface electrode layer is transparent to visible light;
  g. the surface electrode layer is Indium Tin Oxide (ITO);
  h. the surface electrode layer is electrically biased to a constant voltage;
  i. the constant voltage in Item H is nominally around 0V;
  j. a conductive pixel electrode covers substantial area of a said pixel;
  k. a electrical field is established across the P-I-N layers by applying voltages drop between the surface electrode and metal pixel electrode;
  l. P layer is doped with P-type impurity;
  m. I-layer is un-intentionally doped intrinsic layer;
  n. N layer is doped with n-type impurity;
  o. N layer is the layer making electrical and physical contact to the conductive pixel electrode and through the pixel electrode to the underlying CMOS pixel circuitry electrically;
  p. N layer is very resistive to avoid pixel-to-pixel crosstalk;
  q. the high resistivity in N layer is achieved by adding carbon atoms or molecules into N layer;
  r. Item j is made of metal;
  s. Item j is made of metallic nitride;
  t. Item j is made of Titanium Nitride;
  u. Sensor may include a micro-lens array for minimizing crosstalk.

2. Pixel circuitry:
  a. has an insulating layer, fabricated with the known semiconductor process, between the conductive pixel electrode and underlying pixel circuitry;
  b. has at least one via, passing through the insulating layer, connecting electrically the said pixel electrode to said underlying pixel circuitry;
  c. each pixel comprises of a charge collection node, charge sense node, charge storage circuitry, signal reset circuitry and signal readout selection circuitry;
  d. each pixel circuit comprises of three transistors;
  e. the gate of one of the transistor is electrically connected to the charge sense node;
  f. one of the transistor is used for signal reset to a known state;
  g. one of the transistor is used for signal readout selection;
  h. Another embodiment is not to use Items (a) and (b) and have the pixel electrode making direct physical and electrical contact to the diffusion area of the reset transistor (Item f).

3. Array circuitry:
  a. the sensor array has 1.92 million pixels;

b. each pixel is 3 um×3 um;
c. the 1.92 million pixels is formed as 1604 (columns)× 1204 (rows) active area;
d. minimum three opaque pixels, surround the active area;
e. the opaque pixels are used to establish a dark reference for the array;
f. each column has an analog-to-digital converter (ADC);
g. each column has circuits for signal condition, signal amplification and sample-and-hold;
h. the array is arranged to have the signal of even columns and odd columns coming out of from the top and bottom of the array, separately;
i. Items F and G are designed to with the width of two pixels wide;
j. A delta double sampling (DDS) scheme is used to sample the signal and reference voltages consecutively;
k. the sampled signal and reference voltages are converted by the column ADC into digital signals;
l. the difference between the said signals in Item k determines the light level detected by the photo-sensing device;
m. there are two output data ports, one for even columns and one for odd columns
n. the sensor has on-chip circuit to multiplex the even and odd column output to make a pixel-sequential video output through a single port;
o. the sensor has on-chip circuit to accept one single voltage input and generates all bias voltages needed to run various circuits on chip;
p. the sensor has an option not to use the circuit of Item O but to accept multiple voltage inputs to run various circuits on chip;
q. Item G has circuitry providing the selection of multiple signal amplification factors;
r. the multiple signal amplification factor covers 1× to 8×, with 256 increments;
s. the fine increment of amplification factor is to allow fine adjustment for auto exposure control;
t. the sensor array can be covered with color filter;
u. the color filters comprises of Red, Green and Blue filters;
v. the color filter array is arranged with four pixels as a unit, the upper-left pixel covered with Red filter, the upper-right covered with Green filter, the lower-left covered with Green filter and the lower-right covered with Blue filter;
w. there is a timing circuitry on the same chip, which provides all the clocks necessary to operate the pixel and readout circuitry;
x. the timing circuitry also provides the synchronization (pixel, line and frame) signals which enables other chips to interface with this image sensor;
y. the timing circuitry also provide timing control for light exposure time;
z. there are circuits on chip to provide some of the bias voltage to operate other parts of the circuit;
aa. the array and pixel circuits are fabricated with CMOS process.

Variations

Two preferred embodiment of the present invention have been described in detail above. However, many variations from that description may be made within the scope of the present invention. For example, the three-transistor pixel design described above could be replaced with more elaborate pixel circuits (including 4, 5 and 6 transistor designs) described in detail the parent applications. The additional transistors provide certain advantages as described in the referenced applications at the expense of some additional complication. On the opposite direction of implementation, one can design the pixel circuitry such that a common reset transistor is shared by four adjacent pixels. This design can potentially reduce the pixel size. Other transistor sharing schemes among adjacent pixels are also possible. The photoconductive layers described in detail above could be replaced with other electron-hole producing layers as described in the parent application or in the referenced '353 patent. The photodiode layer could be reversed so that the n-doped layer is on top and the p-doped layer is on the bottom in which case the charges would flow through the layers in the opposite direction. The transparent layer could be replaced with a grid of extremely thin conductors. The readout circuitry and the camera circuits 140–148 as shown in FIG. 2 could be located partially or entirely underneath the CMOS pixel array to produce an extremely tiny camera. The CMOS circuits could be replaced partially or entirely by MOS circuits. Some of the circuits 140–148 shown on FIG. 2 could be located on one or more chips other than the chip with the sensor array. For example, there may be cost advantages to separate the circuits 144 and 146 onto a separate chip or into a separate processor altogether. The number of pixels could be decreased below 0.3 mega-pixels or increased above 5.3 million almost without limit. The techniques described for reducing crosstalk can be utilized independent of each other or in any combination.

Variety of Other Camera Applications

This invention provides a camera potentially very small in size, potentially very low in fabrication cost and potentially very high in quality. Naturally there will be tradeoffs made among size, quality and cost, but with the high volume production costs in the range of a few dollars, a size measured in millimeters and image quality measured in mega-pixels or fractions of mega-pixels, the possible applications of the present invention are enormous. Some potential applications in addition to cell phone cameras are listed below:

Analog camcorders
Digital camcorders
Security cameras
Digital still cameras
Personal computer cameras
Toys
Endoscopes
Military unmanned aircraft, bombs and missiles
Sports
High definition Television sensor Eyeball Camera Since the camera can be made smaller than a human eyeball, one embodiment of the present invention is a camera fabricated in the shape of a human eyeball. Since the cost will be low the eyeball camera can be incorporated into many toys and novelty items. A cable may be attached as an optic nerve to take image data to a monitor such as a personal computer monitor. The eyeball camera can be incorporated into dolls or manikins and even equipped with rotational devices and a feedback circuit so that the eyeball could follow a moving feature in its field of view. Instead of the cable the image data could be transmitted wirelessly.

While there have been shown what are presently considered to be preferred embodiments of the present invention, it will be apparent to those skilled in the art that various changes and modifications can be made herein without departing from the scope and spirit of the invention. For example, this camera can be used without the lens to monitor the light intensity profile and output the change of intensity and profile. This is crucial in optical communication application where beam profile needs to be monitored for highest transmission efficiency. This camera can be used to extend light sensing beyond visible spectrum when the amorphous-Silicon is replaced with other light sensing materials. For example, one can use microcrystalline-Silicon to extend the light sensing toward near-infrared range. Such camera is well suited for night vision. In the preferred embodiment, we use a package where senor is mounted onto a chip carrier on which is clicked onto a lens housing. One can also change the assembly sequence by solder the sensor onto a sensor board first, then put the lens holder with lens to cover the sensor and then mechanically fasten onto the PCB board to make a camera. This is a natural variation from this invention to those skilled in the art.

Thus, the scope of the invention is to be determined by the appended claims and their legal equivalents.

What is claimed is:

1. A MOS or CMOS based active sensor array comprising:
  1) a substrate,
  2) a plurality of MOS or CMOS pixel circuits fabricated in or on said substrate, each pixel circuit comprising:
    1) a charge collecting electrode for collecting electrical charges and
    2) plurality of transistors for monitoring periodically charges collected by said charge collecting electrode,
  3) a photodiode layer of charge generating material located above said pixel circuits for converting electromagnetic radiation into electrical charges, said photodiode layer comprising an N-doped layer, a P-doped layer and an intrinsic layer in between said P-doped layer and said N-doped layer, wherein one of said N-doped layer or said P-doped layer defines a bottom photodiode layer, is in electrical contact with said charge collecting electrode and is configured to avoid any significant pixel to pixel crosstalk,
  4) a surface electrode in the form of a thin transparent layer or grid located above said layer of charge generating material; and
  5) a micro-lens array for focusing light of above said charge collecting electrodes and away from pixel edges;
wherein electrical charges generated in regions of said photodiode layer above a particular charge collecting electrode are collected by that particular charge collecting electrode and no substantial portion of said of the electrical charges generated above that particular charge collecting electrode are collected by any other charge collecting electrode.

2. The array as in claim 1 wherein said bottom photodiode layer comprises carbon.

3. The array as in claim 2 wherein said carbon in said bottom layer represents a concentration of between about 5 to 35 percent.

4. The array as in claim 2 wherein voltage differential between adjacent charge collecting electrodes varies within a range of about 0 to 2 Volts.

5. The array as in claim 2 wherein said bottom layer is a P-doped layer.

6. The array as in claim 2 wherein said bottom layer is an N-doped layer.

7. The array as in claim 1 wherein said bottom layer is configured to avoid any significant pixel to pixel crosstalk by minimizing thickness of said bottom layer and adjusting the resistivity of material comprising the bottom layer.

8. The array as in claim 1 wherein said plurality of pixel circuits is at least 0.3 million pixel circuits.

9. The array as in claim 1 wherein said plurality of pixel circuits is at least 2 million pixel circuits.

10. The array as in claim 1 wherein each of said pixels define a surface area equal to or larger than about 1 square microns and smaller than or equal to about 25 square microns.

11. The array as in claim 1 and also comprising image manipulation circuits fabricated on said substrate.

12. The array as in claim 1 where said array is a component of a video camera and said array further comprises output ports representing video output.

13. The array as in claim 12 wherein said video camera includes processor controls for controlling signal output by adjusting pixel illumination time.

14. The array as in claim 1 wherein a plurality of said pixel circuits are covered wit a visible light shield and are configured to operate as dark references.

15. The array as in claim 1 and further comprising a gain adjustment circuit to produce white-balanced signals under various light sources.

16. The array as in claim 1 wherein said array is an integral part of a camera attached by a cable to a cellular phone.

17. The array as in claim 1 and further comprising an array of color filters located on top of said surface electrode.

18. The array as in claim 1 wherein said array is a part of a camera incorporated into a device chosen from the following group:
  Analog camcorder
  Digital camcorder
  Security camera
  Digital still camera
  Personal computer camera
  Toy
  Endoscope
  Military unmanned aircraft, bomb and missile
  Sports equipment
  High definition television camera.

19. The sensor array as in claim 1 and further comprising a plurality of shared pixel transistors, each shared pixel transistor being a part of more than one of pixel circuit in said plurality of pixel circuits.

20. The sensor array as in claim 19 wherein said plurality of shared pixel transistors are reset transistors.

21. A camera with a MOS or CMOS based active sensor array for producing electronic images from electron-hole producing light, said camera comprising:
  A) an active sensor active sensor array comprising:
    1) a substrate,
    2) a plurality of MOS or CMOS pixel circuits fabricated in or on said substrate, each pixel circuit comprising:
      a) a charge collecting electrode for collecting electrical charges and
      b) plurality of transistors for monitoring periodically charges collected by said charge collecting electrode,
    3) a photodiode layer of charge generating material located above said pixel circuits for converting electromagnetic radiation into electrical charges, said photodiode layer comprising an N-doped layer, a P-doped layer and an intrinsic layer in between said P-doped layer and said N-doped layer, wherein one of said N-doped layer or said P-doped layer defines a bottom photodiode layer, is in electrical contact with said charge collecting electrode and is configured to avoid any significant pixel to pixel crosstalk, 4) a surface electrode in the form of a thin transparent layer or grid located above said layer of charge generating material; and 5) a micro-lens array for focusing light of above said charge collecting electrodes and away from pixel edges;

wherein electrical charges generated in regions of said photodiode layer above a particular charge collecting electrode are collected by that particular charge collecting electrode and no substantial portion of said of the electrical charges generated above that particular charge collecting electrode are collected by any other charge collecting electrode;

B) additional MOS or CMOS circuits in and/or on the same crystalline substrate with said active sensor array for generating images, and C) focusing optics for focusing charge producing light onto said active sensor array.

22. The camera as in claim 21 wherein said bottom photodiode layer comprises carbon.

23. The camera as in claim 22 wherein said carbon in said bottom layer represents a concentration of between about 5 to 35 percent.

24. The camera as in claim 21 wherein said bottom layer is a P-doped layer.

25. The Camera as in claim 21 wherein said bottom layer is an N-doped layer.

26. The camera as in claim 21 wherein said bottom layer is configured to avoid any significant pixel to pixel crosstalk by minimizing thickness of said bottom layer and adjusting the resistivity of material comprising the bottom layer.

27. The camera as in claim 21 wherein said plurality of pixel circuits is at least 0.3 million pixel circuits.

28. The camera as in claim 21 wherein said plurality of pixel circuits is at least 1.9 million pixel circuits.

29. The camera as in claim 21 wherein each of said pixels define a surface area equal to or larger than about 1 square micron and smaller than or equal to about 25 square microns.

30. The camera as in claim 21 and also comprising image manipulation circuits fabricated on said substrate.

31. The sensor array as in claim 21 and further comprising a plurality of shared pixel transistors, each shared pixel transistor being a part of more than one of pixel circuit in said plurality pixel circuits.

32. The sensor array as in claim 31 wherein said plurality of shared pixel transistors are reset transistors.

* * * * *